(12) United States Patent
Yamazaki et al.

(10) Patent No.: US 8,188,478 B2
(45) Date of Patent: *May 29, 2012

(54) SEMICONDUCTOR DEVICE AND METHOD OF FABRICATING THE SAME

(75) Inventors: Shunpei Yamazaki, Setagaya (JP); Jun Koyama, Sagamihara (JP); Setsuo Nakajima, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/169,208

(22) Filed: Jun. 27, 2011

(65) Prior Publication Data

US 2011/0255022 A1    Oct. 20, 2011

Related U.S. Application Data

(60) Continuation of application No. 12/728,487, filed on Mar. 22, 2010, now Pat. No. 7,973,312, and a continuation of application No. 10/934,464, filed on Sep. 7, 2004, now Pat. No. 7,705,354, and a division of application No. 09/566,730, filed on May 9, 2000, now Pat. No. 6,806,495.

(30) Foreign Application Priority Data

Mar. 6, 2000 (JP) ................. 2000-061297

(51) Int. Cl.
*H01L 29/04* (2006.01)

(52) U.S. Cl. ............... 257/59; 257/72; 257/350; 349/42
(58) Field of Classification Search ............ 257/59, 257/72, 350; 349/28, 39, 42, 46
See application file for complete search history.

(56) References Cited

U.S. PATENT DOCUMENTS

| | | | |
|---|---|---|---|
| 3,967,981 A | 7/1976 | Yamazaki |
| 4,458,987 A | 7/1984 | Sasaki et al. |
| 4,624,737 A | 11/1986 | Shimbo |
| 4,730,903 A | 3/1988 | Yamazaki et al. |
| 4,914,503 A | 4/1990 | Shirato et al. |

(Continued)

FOREIGN PATENT DOCUMENTS

EP    0 557 110    8/1993

(Continued)

OTHER PUBLICATIONS

Specification, claims, abstract, and drawings of U.S. Appl. No. 09/635,945, filed Aug. 10, 2000.

(Continued)

*Primary Examiner* — Ahmed Sefer
(74) *Attorney, Agent, or Firm* — Eric J. Robinson; Robinson Intellectual Property Law Office, P.C.

(57) ABSTRACT

A display device includes a main body, a support stand, and a display portion. The display portion includes a pixel having a TFT and a capacitor. The capacitor includes a capacitor electrode on an insulating surface, an insulating film on the capacitor electrode, and a pixel electrode of the TFT on the insulating film.

48 Claims, 11 Drawing Sheets

U.S. PATENT DOCUMENTS

| | | |
|---|---|---|
| 4,960,719 A | 10/1990 | Tanaka et al. |
| 5,028,551 A | 7/1991 | Dohjo et al. |
| 5,084,961 A | 2/1992 | Yoshikawa |
| 5,151,806 A | 9/1992 | Kawamoto et al. |
| 5,231,039 A | 7/1993 | Sakono et al. |
| 5,261,156 A | 11/1993 | Mase et al. |
| 5,346,833 A | 9/1994 | Wu |
| 5,362,660 A | 11/1994 | Kwasnick et al. |
| 5,418,635 A | 5/1995 | Mitsui et al. |
| 5,428,250 A | 6/1995 | Ikeda et al. |
| 5,459,598 A | 10/1995 | Carrington |
| 5,466,617 A | 11/1995 | Shannon |
| 5,478,766 A | 12/1995 | Park et al. |
| 5,491,352 A | 2/1996 | Tsuji |
| 5,532,180 A | 7/1996 | den Boer et al. |
| 5,539,219 A | 7/1996 | den Boer et al. |
| 5,561,074 A | 10/1996 | Koide et al. |
| 5,561,440 A | 10/1996 | Kitajima et al. |
| 5,583,675 A | 12/1996 | Yamada et al. |
| 5,622,814 A | 4/1997 | Miyata et al. |
| 5,644,147 A | 7/1997 | Yamazaki et al. |
| 5,648,662 A | 7/1997 | Zhang et al. |
| 5,668,379 A | 9/1997 | Ono et al. |
| 5,668,651 A | 9/1997 | Yamada et al. |
| 5,684,318 A | 11/1997 | Ayres et al. |
| 5,706,064 A | 1/1998 | Fukunaga et al. |
| 5,708,484 A | 1/1998 | Someya et al. |
| 5,710,612 A | 1/1998 | Mase |
| 5,729,312 A | 3/1998 | Yamagishi et al. |
| 5,734,177 A | 3/1998 | Sakamoto |
| 5,739,549 A | 4/1998 | Takemura et al. |
| 5,739,880 A | 4/1998 | Suzuki et al. |
| 5,739,882 A | 4/1998 | Shimizu et al. |
| 5,739,887 A | 4/1998 | Ueda et al. |
| 5,744,820 A | 4/1998 | Matsushima et al. |
| 5,748,179 A | 5/1998 | Ito et al. |
| 5,757,453 A | 5/1998 | Shin et al. |
| 5,757,456 A | 5/1998 | Yamazaki et al. |
| 5,760,854 A | 6/1998 | Ono et al. |
| 5,766,977 A | 6/1998 | Yamazaki |
| 5,780,872 A | 7/1998 | Misawa et al. |
| 5,793,072 A | 8/1998 | Kuo |
| 5,798,812 A | 8/1998 | Nishiki et al. |
| 5,804,501 A | 9/1998 | Kim |
| 5,811,318 A | 9/1998 | Kweon |
| 5,811,328 A | 9/1998 | Zhang et al. |
| 5,811,835 A | 9/1998 | Seiki et al. |
| 5,811,846 A | 9/1998 | Miura et al. |
| 5,818,070 A | 10/1998 | Yamazaki et al. |
| 5,821,138 A | 10/1998 | Yamazaki et al. |
| 5,821,622 A | 10/1998 | Tsuji et al. |
| 5,825,449 A | 10/1998 | Shin |
| 5,828,433 A | 10/1998 | Shin |
| 5,830,785 A | 11/1998 | Sanson et al. |
| 5,831,710 A | 11/1998 | Colgan et al. |
| 5,834,327 A | 11/1998 | Yamazaki et al. |
| 5,838,400 A | 11/1998 | Ueda et al. |
| 5,844,643 A | 12/1998 | Onishi et al. |
| 5,847,687 A | 12/1998 | Hirakata et al. |
| 5,849,601 A | 12/1998 | Yamazaki |
| 5,852,481 A | 12/1998 | Hwang |
| 5,852,487 A | 12/1998 | Fujimori et al. |
| 5,867,233 A | 2/1999 | Tanaka |
| 5,872,611 A | 2/1999 | Hirata et al. |
| 5,874,326 A | 2/1999 | Lyu |
| 5,880,794 A | 3/1999 | Hwang |
| 5,888,855 A | 3/1999 | Nagahisa et al. |
| 5,889,291 A | 3/1999 | Koyama et al. |
| 5,892,562 A | 4/1999 | Yamazaki et al. |
| 5,899,547 A | 5/1999 | Yamazaki et al. |
| 5,903,326 A | 5/1999 | Lee |
| 5,907,380 A | 5/1999 | Lien |
| 5,917,564 A | 6/1999 | Kim et al. |
| 5,917,567 A | 6/1999 | Oh et al. |
| 5,940,154 A | 8/1999 | Ukita et al. |
| 5,942,767 A | 8/1999 | Na et al. |
| 5,943,559 A | 8/1999 | Maeda |
| 5,953,093 A | 9/1999 | Hirata et al. |
| 5,959,599 A | 9/1999 | Hirakata et al. |
| 5,966,189 A | 10/1999 | Matsuo |
| 5,968,850 A | 10/1999 | Jeong et al. |
| 5,977,562 A | 11/1999 | Hirakata et al. |
| 5,986,724 A | 11/1999 | Akiyama et al. |
| 5,990,998 A | 11/1999 | Park et al. |
| 5,994,721 A | 11/1999 | Zhong et al. |
| 5,995,190 A | 11/1999 | Nagae et al. |
| 5,998,229 A | 12/1999 | Lyu et al. |
| 5,998,230 A | 12/1999 | Gee-Sung et al. |
| 6,008,065 A | 12/1999 | Lee et al. |
| 6,008,869 A | 12/1999 | Oana et al. |
| 6,020,598 A | 2/2000 | Yamazaki |
| 6,025,216 A | 2/2000 | Ha |
| 6,025,891 A | 2/2000 | Kim |
| 6,025,892 A | 2/2000 | Kawai et al. |
| 6,037,017 A | 3/2000 | Kashiro |
| 6,038,003 A | 3/2000 | Kim |
| 6,054,975 A | 4/2000 | Kurokawa et al. |
| 6,055,028 A | 4/2000 | Nishi et al. |
| 6,061,112 A | 5/2000 | Ukita et al. |
| 6,064,358 A | 5/2000 | Kitajima et al. |
| 6,064,456 A | 5/2000 | Taniguchi et al. |
| 6,067,141 A | 5/2000 | Yamada et al. |
| 6,072,556 A | 6/2000 | Hirakata et al. |
| 6,072,557 A | 6/2000 | Kishimoto |
| 6,075,257 A | 6/2000 | Song |
| 6,097,458 A | 8/2000 | Tsuda et al. |
| 6,097,459 A | 8/2000 | Shimada et al. |
| 6,097,465 A | 8/2000 | Hiroki et al. |
| 6,114,184 A | 9/2000 | Matsumoto et al. |
| 6,118,502 A | 9/2000 | Yamazaki et al. |
| 6,124,155 A | 9/2000 | Zhang et al. |
| 6,124,604 A | 9/2000 | Koyama et al. |
| 6,124,606 A | 9/2000 | den Boer et al. |
| 6,130,443 A | 10/2000 | Hong et al. |
| 6,130,729 A | 10/2000 | Oh et al. |
| 6,133,977 A | 10/2000 | Lee et al. |
| 6,140,158 A | 10/2000 | Rhee et al. |
| 6,141,077 A | 10/2000 | Hirata et al. |
| 6,153,893 A | 11/2000 | Inoue et al. |
| 6,160,600 A | 12/2000 | Yamazaki et al. |
| 6,166,396 A | 12/2000 | Yamazaki |
| 6,166,399 A | 12/2000 | Zhang et al. |
| 6,172,728 B1 | 1/2001 | Hiraishi |
| 6,177,968 B1 | 1/2001 | Okada et al. |
| 6,184,946 B1 | 2/2001 | Ando et al. |
| 6,188,452 B1 | 2/2001 | Kim et al. |
| 6,190,933 B1 | 2/2001 | Shimabukuro et al. |
| 6,197,625 B1 | 3/2001 | Choi |
| 6,198,133 B1 | 3/2001 | Yamazaki et al. |
| 6,208,390 B1 | 3/2001 | Ejiri et al. |
| 6,208,395 B1 | 3/2001 | Kanoh et al. |
| 6,215,541 B1 | 4/2001 | Song et al. |
| 6,218,219 B1 | 4/2001 | Yamazaki et al. |
| 6,218,221 B1 | 4/2001 | Sah |
| 6,222,603 B1 | 4/2001 | Sakai et al. |
| 6,235,561 B1 | 5/2001 | Saiki et al. |
| 6,239,854 B1 | 5/2001 | Hirakata et al. |
| 6,243,064 B1 | 6/2001 | Hirakata |
| 6,255,668 B1 | 7/2001 | Kang et al. |
| 6,265,889 B1 | 7/2001 | Tomita et al. |
| 6,266,117 B1 | 7/2001 | Yanagawa et al. |
| 6,266,121 B1 | 7/2001 | Shigeta et al. |
| 6,266,122 B1 | 7/2001 | Kishimoto et al. |
| 6,268,617 B1 | 7/2001 | Hirakata et al. |
| 6,271,903 B1 | 8/2001 | Shin et al. |
| 6,287,899 B1 | 9/2001 | Park et al. |
| 6,297,519 B1 | 10/2001 | Fujikawa et al. |
| 6,300,926 B1 | 10/2001 | Yoneya et al. |
| 6,304,243 B1 | 10/2001 | Kondo et al. |
| 6,317,185 B1 | 11/2001 | Harano et al. |
| 6,317,187 B1 | 11/2001 | Nakajima et al. |
| 6,323,051 B1 | 11/2001 | Shimada |
| 6,330,049 B1 | 12/2001 | Kume et al. |
| 6,331,845 B1 | 12/2001 | Kitajima et al. |
| 6,331,881 B1 | 12/2001 | Hatano et al. |
| 6,335,213 B1 | 1/2002 | Zhang et al. |
| 6,335,778 B1 | 1/2002 | Kubota et al. |

| | | |
|---|---|---|
| 6,339,462 B1 | 1/2002 | Kishimoto et al. |
| 6,341,002 B1 | 1/2002 | Shimizu et al. |
| 6,342,939 B1 | 1/2002 | Hirata et al. |
| 6,344,888 B2 | 2/2002 | Yasukawa |
| 6,359,672 B2 | 3/2002 | Gu et al. |
| 6,362,866 B1 | 3/2002 | Yamazaki et al. |
| 6,365,933 B1 | 4/2002 | Yamazaki et al. |
| 6,368,485 B1 | 4/2002 | Ue et al. |
| 6,384,818 B1 | 5/2002 | Yamazaki et al. |
| 6,387,737 B1 | 5/2002 | Yamazaki et al. |
| 6,407,431 B2 | 6/2002 | Yamazaki et al. |
| 6,411,358 B2 | 6/2002 | Song et al. |
| 6,429,057 B1 | 8/2002 | Hong et al. |
| 6,433,842 B1 | 8/2002 | Kaneko et al. |
| 6,437,844 B1 | 8/2002 | Hattori et al. |
| 6,441,399 B1 | 8/2002 | Koyama et al. |
| 6,456,269 B2 | 9/2002 | Hirakata |
| 6,462,802 B1 | 10/2002 | Nishimura et al. |
| 6,465,268 B2 | 10/2002 | Hirakata et al. |
| 6,466,289 B1 | 10/2002 | Lee et al. |
| 6,493,050 B1 | 12/2002 | Lien et al. |
| 6,498,634 B1 | 12/2002 | Yamazaki et al. |
| 6,519,018 B1 | 2/2003 | Samant et al. |
| 6,528,357 B2 | 3/2003 | Dojo et al. |
| 6,529,256 B1 | 3/2003 | Seo |
| 6,531,392 B2 | 3/2003 | Song et al. |
| 6,567,146 B2 | 5/2003 | Hirakata et al. |
| 6,573,564 B2 | 6/2003 | Yamazaki et al. |
| 6,583,065 B1 | 6/2003 | Williams et al. |
| 6,587,162 B1 | 7/2003 | Kaneko et al. |
| 6,599,791 B1 | 7/2003 | Koyama et al. |
| 6,611,309 B2 | 8/2003 | Park et al. |
| 6,617,644 B1 | 9/2003 | Yamazaki et al. |
| 6,617,648 B1 | 9/2003 | Yamazaki et al. |
| 6,621,102 B2 | 9/2003 | Hirakata et al. |
| 6,624,864 B1 | 9/2003 | Kubo et al. |
| 6,630,977 B1 | 10/2003 | Yamazaki et al. |
| 6,642,074 B2 | 11/2003 | Hong et al. |
| 6,661,488 B1 | 12/2003 | Takeda et al. |
| 6,671,025 B1 | 12/2003 | Ikeda et al. |
| 6,697,129 B1 | 2/2004 | Nishi et al. |
| 6,709,901 B1 | 3/2004 | Yamazaki et al. |
| 6,743,650 B2 | 6/2004 | Hirakata et al. |
| 6,747,288 B2 | 6/2004 | Yamazaki et al. |
| 6,756,258 B2 | 6/2004 | Zhang et al. |
| 6,762,082 B2 | 7/2004 | Yamazaki et al. |
| 6,762,813 B1 | 7/2004 | Zhang et al. |
| 6,771,342 B1 | 8/2004 | Hirataka et al. |
| 6,774,974 B1 | 8/2004 | Matsuyama |
| 6,787,809 B2 | 9/2004 | Hong et al. |
| 6,797,548 B2 | 9/2004 | Zhang et al. |
| 6,806,495 B1 | 10/2004 | Yamazaki et al. |
| 6,806,499 B2 | 10/2004 | Yamazaki et al. |
| 6,806,937 B2 | 10/2004 | Park et al. |
| 6,847,064 B2 | 1/2005 | Zhang et al. |
| 6,855,957 B1 | 2/2005 | Yamazaki et al. |
| 6,856,360 B1 | 2/2005 | Higuchi et al. |
| 6,856,372 B2 | 2/2005 | Song et al. |
| 6,861,670 B1 | 3/2005 | Ohtani et al. |
| 6,873,312 B2 | 3/2005 | Matsueda |
| 6,900,084 B1 | 5/2005 | Yamazaki |
| 6,911,962 B1 | 6/2005 | Hirakata et al. |
| 6,914,655 B2 | 7/2005 | Yamazaki et al. |
| 6,950,168 B2 | 9/2005 | Yamazaki et al. |
| 7,016,003 B2 | 3/2006 | Hirakata et al. |
| 7,019,329 B2 | 3/2006 | Yamazaki et al. |
| 7,071,037 B2 | 7/2006 | Suzawa et al. |
| 7,078,255 B2 | 7/2006 | Hong et al. |
| 7,102,165 B2 | 9/2006 | Yamazaki |
| 7,102,718 B1 | 9/2006 | Yamazaki et al. |
| 7,145,173 B2 | 12/2006 | Koyama et al. |
| 7,166,862 B2 | 1/2007 | Koyama et al. |
| 7,202,497 B2 | 4/2007 | Ohtani et al. |
| 7,235,810 B1 | 6/2007 | Yamazaki et al. |
| 7,259,427 B2 | 8/2007 | Yamazaki et al. |
| 7,279,711 B1 | 10/2007 | Yamazaki et al. |
| 7,317,438 B2 | 1/2008 | Yamazaki et al. |
| 7,323,715 B2 | 1/2008 | Yamazaki |
| 7,403,238 B2 | 7/2008 | Higuchi et al. |
| 7,414,266 B2 | 8/2008 | Yamazaki et al. |
| 7,507,991 B2 | 3/2009 | Zhang et al. |
| 7,511,776 B2 | 3/2009 | Nishi et al. |
| 7,652,294 B2 | 1/2010 | Yamazaki et al. |
| 7,656,491 B2 | 2/2010 | Yamazaki et al. |
| 7,687,325 B2 | 3/2010 | Yamazaki et al. |
| 7,705,354 B2 * | 4/2010 | Yamazaki et al. .............. 257/59 |
| 7,714,975 B1 | 5/2010 | Yamazaki et al. |
| 7,728,334 B2 | 6/2010 | Yamazaki et al. |
| 7,902,550 B2 | 3/2011 | Yamazaki |
| 7,923,779 B2 | 4/2011 | Yamazaki et al. |
| 7,961,263 B2 | 6/2011 | Song et al. |
| 7,973,312 B2 * | 7/2011 | Yamazaki et al. .............. 257/59 |
| 2004/0207789 A1 | 10/2004 | Hirakata et al. |
| 2004/0218112 A1 | 11/2004 | Hirakata et al. |
| 2005/0082536 A1 | 4/2005 | Park et al. |
| 2005/0098894 A1 | 5/2005 | Ohtani et al. |
| 2006/0228821 A1 | 10/2006 | Hong et al. |
| 2007/0146568 A1 | 6/2007 | Yamazaki et al. |
| 2010/0120180 A1 | 5/2010 | Yamazaki et al. |
| 2010/0195013 A1 | 8/2010 | Yamazaki et al. |
| 2010/0238393 A1 | 9/2010 | Yamazaki et al. |

FOREIGN PATENT DOCUMENTS

| | | |
|---|---|---|
| EP | 0 629 003 | 12/1994 |
| EP | 0 678 907 | 10/1995 |
| EP | 1 001 467 | 5/2000 |
| EP | 1 006 589 | 6/2000 |
| EP | 1 041 622 | 10/2000 |
| JP | 62-131578 | 6/1987 |
| JP | 63-082405 | 4/1988 |
| JP | 01-210989 | 8/1989 |
| JP | 05-034717 | 2/1993 |
| JP | 05-119331 | 5/1993 |
| JP | 05-142558 | 6/1993 |
| JP | 05-175500 | 7/1993 |
| JP | 05-265020 | 10/1993 |
| JP | 05-323371 | 12/1993 |
| JP | 06-045354 | 2/1994 |
| JP | 06-082754 | 3/1994 |
| JP | 06-148683 | 5/1994 |
| JP | 06-194615 | 7/1994 |
| JP | 06-250210 | 9/1994 |
| JP | 07-013196 | 1/1995 |
| JP | 07-159776 | 6/1995 |
| JP | 07-191348 | 7/1995 |
| JP | 07-318975 | 12/1995 |
| JP | 08-087030 | 4/1996 |
| JP | 08-087033 | 4/1996 |
| JP | 09-005767 | 1/1997 |
| JP | 09-015621 | 1/1997 |
| JP | 09-054318 | 2/1997 |
| JP | 09-073101 | 3/1997 |
| JP | 09-074257 | 3/1997 |
| JP | 09-152626 | 6/1997 |
| JP | 09-153618 | 6/1997 |
| JP | 09-274444 | 10/1997 |
| JP | 10-048651 | 2/1998 |
| JP | 10-048663 | 2/1998 |
| JP | 10-123574 | 5/1998 |
| JP | 10-135469 | 5/1998 |
| JP | 10-170959 | 6/1998 |
| JP | 11-024063 | 1/1999 |
| JP | 11-103067 | 4/1999 |
| JP | 11-109372 | 4/1999 |
| JP | 11-133455 | 5/1999 |
| JP | 11-160732 | 6/1999 |
| JP | 11-160735 | 6/1999 |
| JP | 11-202368 | 7/1999 |
| JP | 11-258596 | 9/1999 |
| JP | 11-258625 | 9/1999 |
| JP | 11-264998 | 9/1999 |
| JP | 11-337978 | 12/1999 |
| JP | 11-352322 | 12/1999 |
| JP | 2000-002886 | 1/2000 |
| JP | 2000-075302 | 3/2000 |
| JP | 2000-111901 | 4/2000 |
| JP | 2000-341242 | 12/2000 |

| | | |
|---|---|---|
| JP | 2001-085698 | 3/2001 |
| JP | 2001-250953 | 9/2001 |
| KR | 1996-0000262 | 1/1996 |
| KR | 1997-0024311 | 5/1997 |
| KR | 1998-072232 | 11/1998 |
| KR | 161466 | 1/1999 |
| KR | 1999-011210 | 2/1999 |
| KR | 180323 | 4/1999 |
| KR | 1999-063319 | 7/1999 |
| KR | 1999-074563 | 10/1999 |
| KR | 1999-075407 | 10/1999 |
| KR | 2000-033515 | 6/2000 |
| KR | 10-0510439 | 10/2005 |

OTHER PUBLICATIONS

Wolf, et al., "Silicon Processing for the VLSI Era, vol. 1: Process Technology," 1986, Lattice Press, pp. 161-175 and 335.

Office Action (Korean Application No. 2007-089013) dated Nov. 14, 2007.

Wolf, et al., "Silicon Processing for the VLSI Era, vol. 1: Process Technology," 1986, Lattice Press, pp. 359-365.

\* cited by examiner

FIG. 4
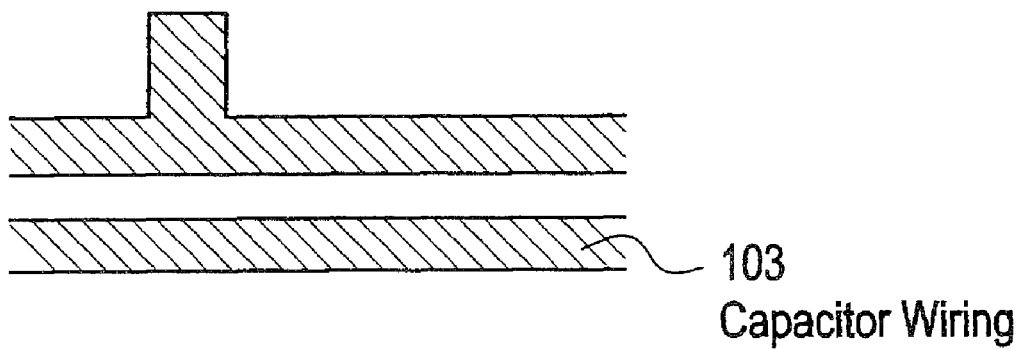
103 Capacitor Wiring
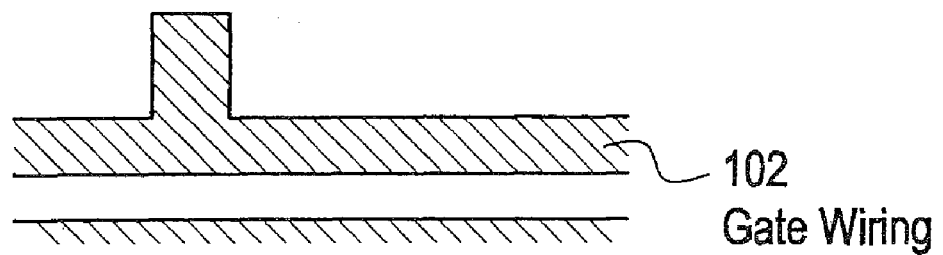
102 Gate Wiring

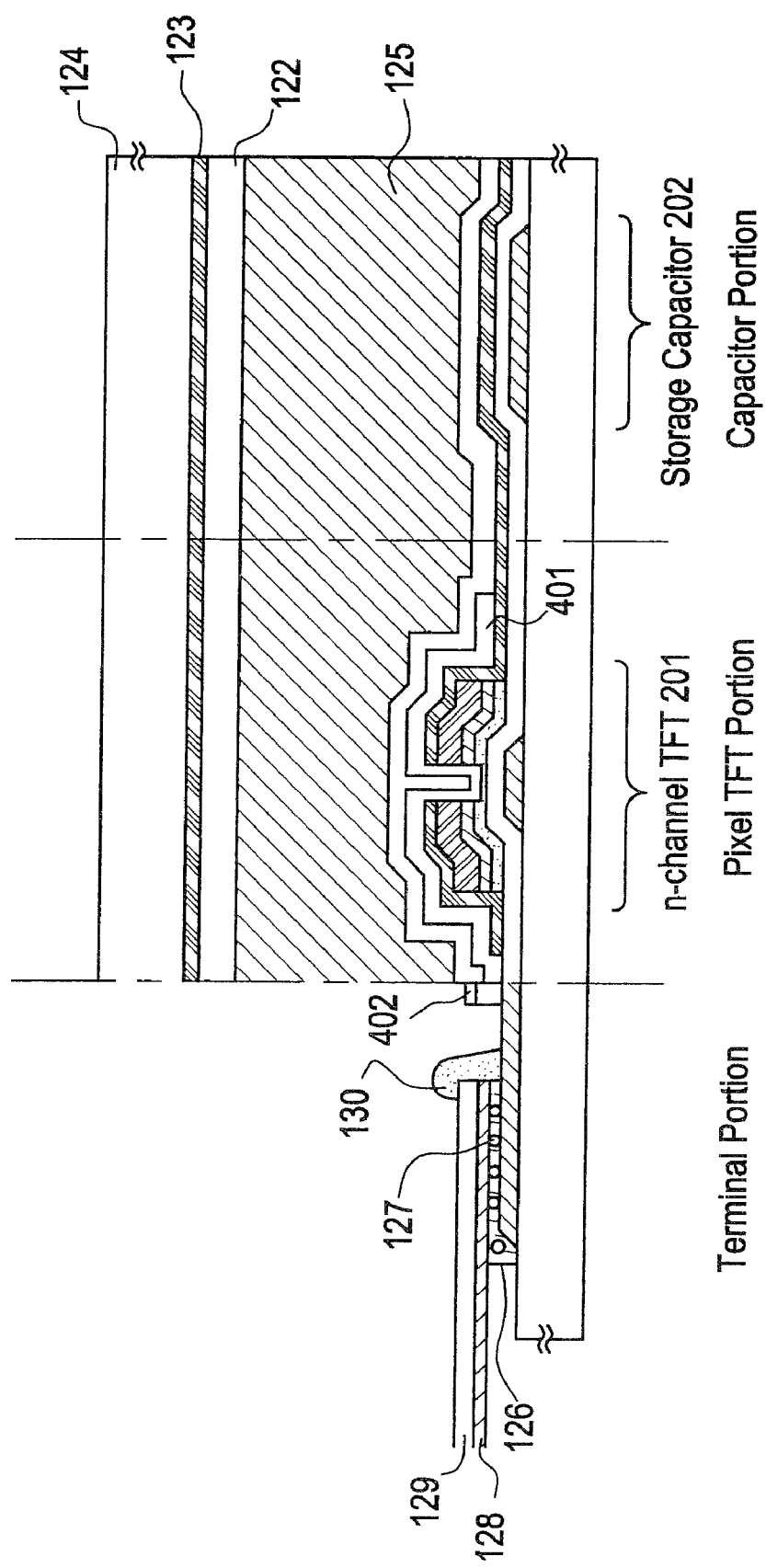

Projection Device (three-plate system)

Light Source Optical System

SEMICONDUCTOR DEVICE AND METHOD OF FABRICATING THE SAME

BACKGROUND OF THE INVENTION

1. Field of the Invention

The invention of the present application relates to a semiconductor device having a circuit which is configured of thin film transistors (hereinbelow termed "TFTs"), and a method of fabricating the semiconductor device. By way of example, it relates to an electrooptical device which is typified by a liquid crystal display panel, and an electronic equipment in which such an electrooptical device is installed as a component.

Incidentally, here in this specification, the "semiconductor device" is intended to signify general devices which can function by utilizing semiconductor properties, and electrooptical devices, semiconductor circuits and electronic equipment are all the semiconductor devices.

2. Description of Related Art

In recent years, notice has been taken of technology wherein thin film transistors (TFTs) are constructed using a semiconductor thin film (having a thickness on the order of several~a few hundred nm) which is formed on a substrate having an insulating surface. The TFTs are extensively applied to ICs and electron devices such as electrooptical devices, and it is especially hurried to develop them as the switching elements of an image display device.

Hitherto, liquid crystal display devices have been known as image display devices. The liquid crystal display device of active matrix type has come to be often employed because an image of higher definition than by the liquid crystal display device of passive type can be obtained. In the active matrix type liquid crystal display device, a display pattern is formed on a screen by driving pixel electrodes arranged in the shape of a matrix. More specifically, voltages are applied between selected ones of the pixel electrodes and ones of counter electrodes corresponding to the selected pixel electrodes, whereby a liquid crystal layer interposed between the pixel electrodes and the counter electrodes is optically modulated, and the optical modulation is recognized as the display pattern by an observer.

The applications of such an active matrix type liquid crystal display device have widened, and a higher definition, a higher aperture efficiency and a higher reliability have been more required together with the larger area of a screen size. Besides, enhancement in productivity and reduction in cost have been more required at the same time.

In the prior art, an amorphous silicon film is suitably employed as an amorphous semiconductor film for the reason that it can be formed on a substrate of large area at a low temperature of or below 300. Also, TFTs of inverse stagger type (or bottom gate type) each having a channel forming region formed of an amorphous semiconductor film are often employed.

BRIEF SUMMARY OF THE INVENTION

Heretofore, a liquid crystal display device of active matrix type has been high in its manufacturing cost for the reason that TFTs have been fabricated on a substrate by using, at least, five photo-masks in accordance with photolithographic technology. In order to enhance a productivity and to enhance an available percentage, decreasing the number of steps is considered as effective means.

Concretely, it is necessary to decrease the number of photo-masks required for the manufacture of TFTs. The photo-mask is employed for forming a photoresist pattern to serve as the mask of an etching step, over a substrate in the photolithographic technology.

Using each of the photo-masks, steps such as coating with a resist, pre-baking, exposure to light, image development and post-baking are performed, and steps such as the formation and etching of a film and further steps such as stripping off the resist, washing and drying are added as the preceding and succeeding steps of the first-mentioned steps. These steps are complicated, and have been problematic.

Moreover, since the substrate is an insulator, static electricity has been generated by friction etc. during the manufacturing process. When the static electricity is generated, short-circuiting arises at the intersection part of wirings laid over the substrate, or the TFTs are deteriorated or destroyed by the static electricity, so that display defects or degradation in an image quality have/has occurred in the liquid crystal display device. In particular, during the rubbing of liquid crystal orientation processing which is performed in the manufacturing process, the static electricity appears and has been problematic.

The present invention consists in replying to such problems, and in a semiconductor device typified by a liquid crystal display device of active matrix type, it has for its object to decrease the number of steps for fabricating TFTs, thereby to realize reduction in a manufacturing cost and enhancement in an available percentage.

Also, it has for its object to provide a structure capable of solving the problem of the destruction of TFTs or the characteristics deterioration thereof ascribable to static electricity, and a method of fabricating the structure.

In order to solve the problems, according to the present invention, each gate wiring is initially formed by a first photo-mask.

Subsequently, a gate insulating film, a non-doped amorphous silicon film (hereinbelow, called "a-Si film"), an amorphous silicon film which contains an impurity element bestowing the n-type (hereinbelow, called "n⁺a-Si film"), and an electrically-conductive film are formed in succession.

Subsequently, an active layer, a source wiring (including a electrode) and a drain electrode which are made of the a-Si film are patterned and formed by a second photo-mask.

Thereafter, a transparent electrically-conductive film is formed, whereupon a pixel electrode made of the transparent conductive film is formed by a third photo-mask. Further, a source region and a drain region which are made of the n⁺a-Si film are formed, while at the same time, part of the a-Si film is removed.

Owing to such a construction, the number of the photo-masks for use in photolithographic technology can be made three.

Moreover, the source wiring is covered with the transparent conductive film which is the same material as that of the pixel electrode, thereby to form a structure in which the whole substrate is protected from external static electricity etc. It is also allowed to form a structure in which a protective circuit is formed of the transparent conductive film. Owing to such a construction, the generation of the static electricity which is ascribable to the friction between a manufacturing apparatus and the insulator substrate can be prevented during a manufacturing process. In particular, TFTs etc. can be protected from the static electricity which appears during the rubbing of liquid crystal orientation processing that is performed in the manufacturing process.

BRIEF DESCRIPTION OF THE DRAWINGS

FIG. 4 Top plan views showing the steps of fabricating the AM-LCD.

FIG. 8 Sectional view showing the step of fabricating an AM-LCD.

DETAILED DESCRIPTION OF THE INVENTION

Figure 1:
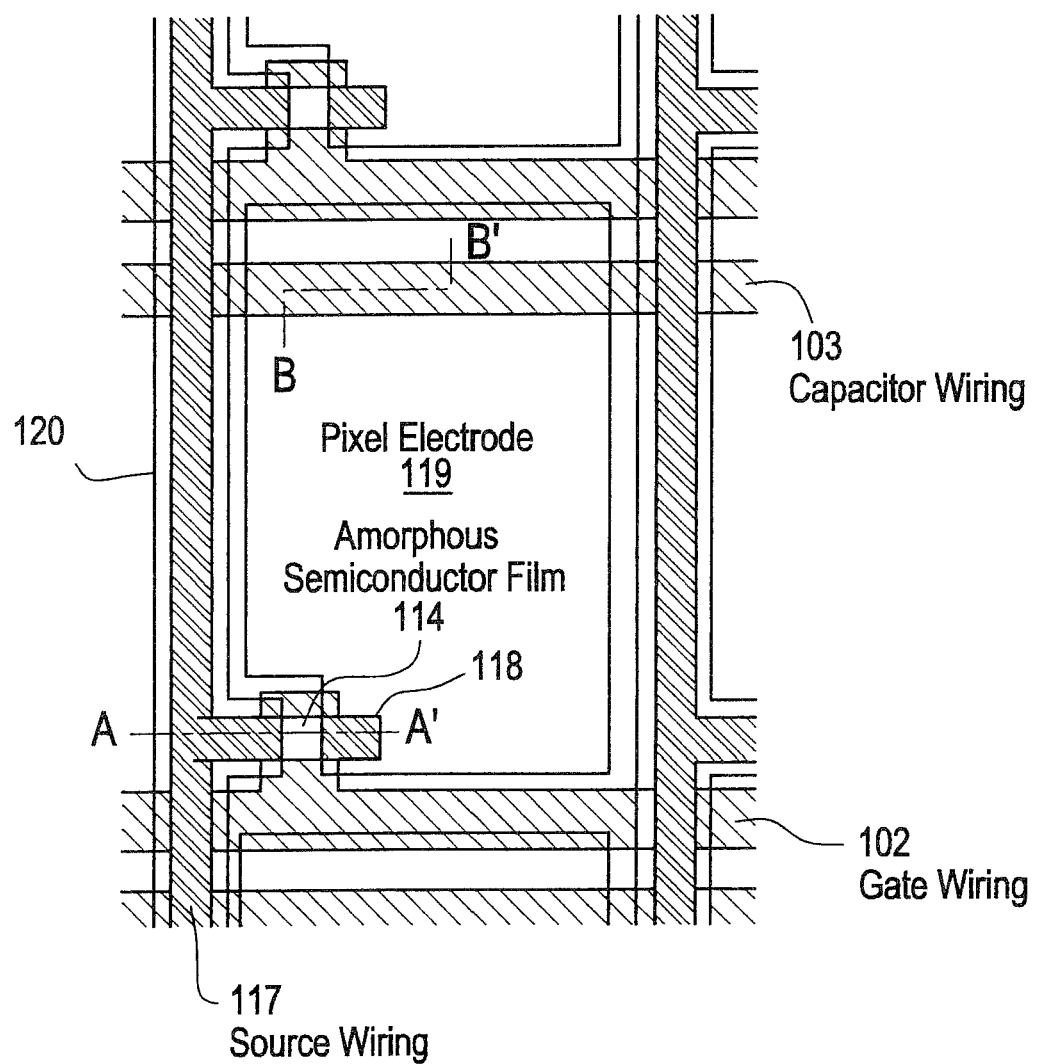
FIG. 1 View showing a top plan in the invention of the present invention.

The construction of an invention disclosed here in this specification consists in:

a semiconductor device having a gate wiring, a source wiring, and a pixel electrode, characterized by comprising:

the gate wiring 102 which is formed on an insulating surface;

an insulating film 104 which is formed on said gate wiring;

an amorphous semiconductor film 114 which is formed on said insulating film;

a source region 115 and a drain region 116 which are formed on said amorphous semiconductor film;

the source wiring 117 or a electrode 118 which is formed on said source region or said drain region; and the pixel electrode 119 which is formed on said electrode; wherein one end face of said drain region 116 or said source region 115 lies substantially in register with an end face of said amorphous semiconductor film 114 and an end face of said electrode 118.

Besides, the construction of another invention consists in:

a semiconductor device having a gate wiring, a source wiring, and a pixel electrode, characterized by comprising:

the gate wiring 102 which is formed on an insulating surface;

an insulating film 104 which is formed on said gate wiring;

an amorphous semiconductor film 114 which is formed on said insulating film;

a source region 115 and a drain region 116 which are formed on said amorphous semiconductor film;

the source wiring 117 or a electrode 118 which is formed on said source region or said drain region; and the pixel electrode 119 which is formed on said electrode; wherein one end face of said drain region 115 or said source 116 region lies substantially in register with an end face 114 of said amorphous semiconductor film and an end face of said electrode 118, and the other end face thereof lies substantially in register with an end face of said pixel electrode 119 and the other end face of said electrode 118.

DETAILED DESCRIPTION OF THE INVENTION

Also, the construction of another invention consists in:

a semiconductor device having a gate wiring, a source wiring, and a pixel electrode, characterized by comprising:

the gate wiring 102 which is formed on an insulating surface;

an insulating film 104 which is formed on said gate wiring;

an amorphous semiconductor film 114 which is formed on said insulating film;

a source region 115 and a drain region 116 which are formed on said amorphous semiconductor film;

the source wiring 117 or a electrode 118 which is formed on said source region or said drain region; and the pixel electrode 119 which is formed on said electrode; wherein said amorphous semiconductor film, and an amorphous semiconductor film which contains an impurity element bestowing the n-type are stacked below said source wiring 117.

Also, in each of the above constructions, the semiconductor device is characterized in that said source region and said drain region are made of an amorphous semiconductor film which contains an impurity element bestowing the n-type.

Also, in each of the above constructions, the semiconductor device is characterized in that said insulating film, said amorphous semiconductor film, said source region and said drain region are formed successively without being exposed to the atmospheric air.

Also, in each of the above constructions, the semiconductor device is characterized in that said insulating film, said amorphous semiconductor film, said source region or said drain region is formed by a sputtering process.

Figure 2:
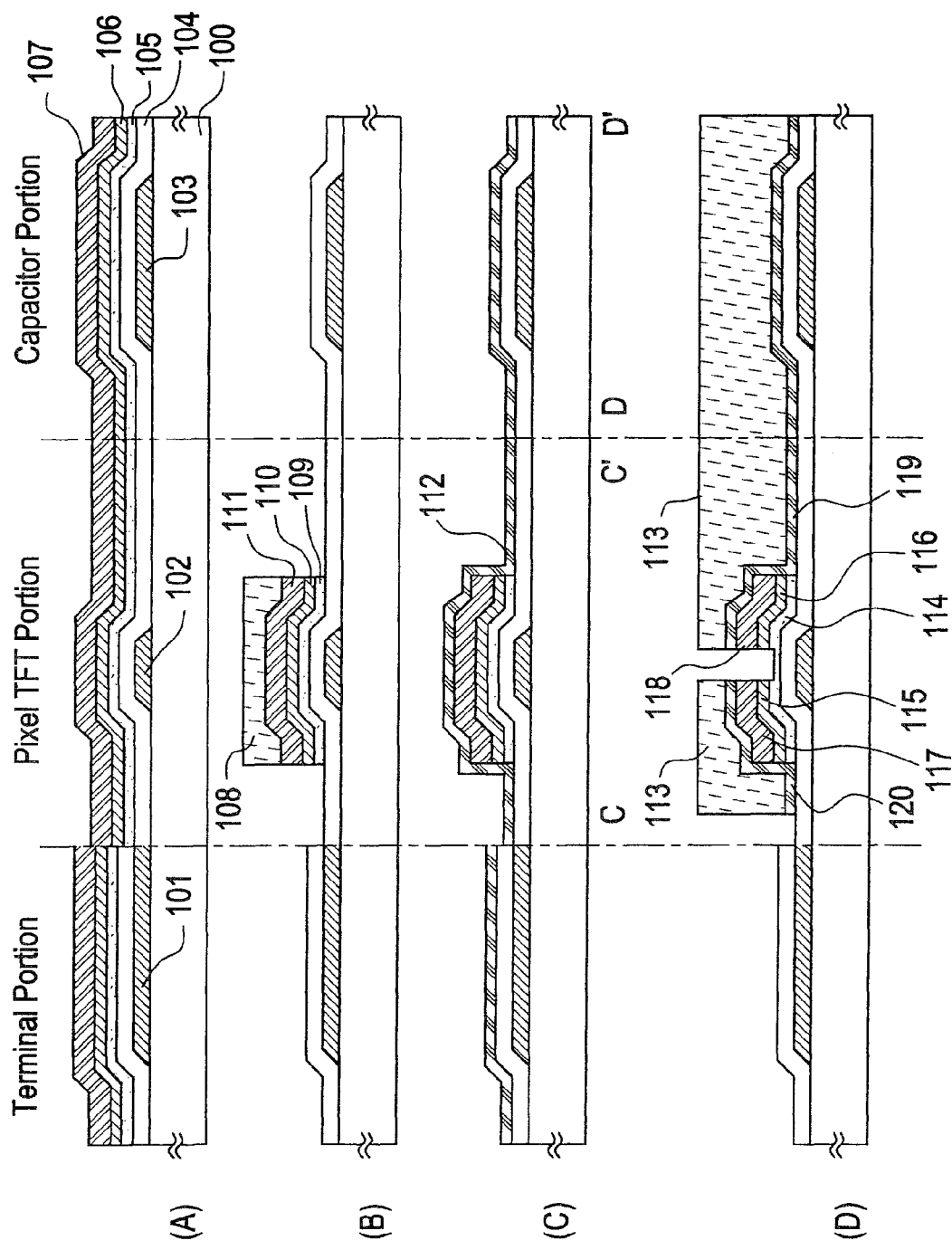
FIG. 2 Sectional views showing the steps of fabricating an AM-LCD.
Figure 3:
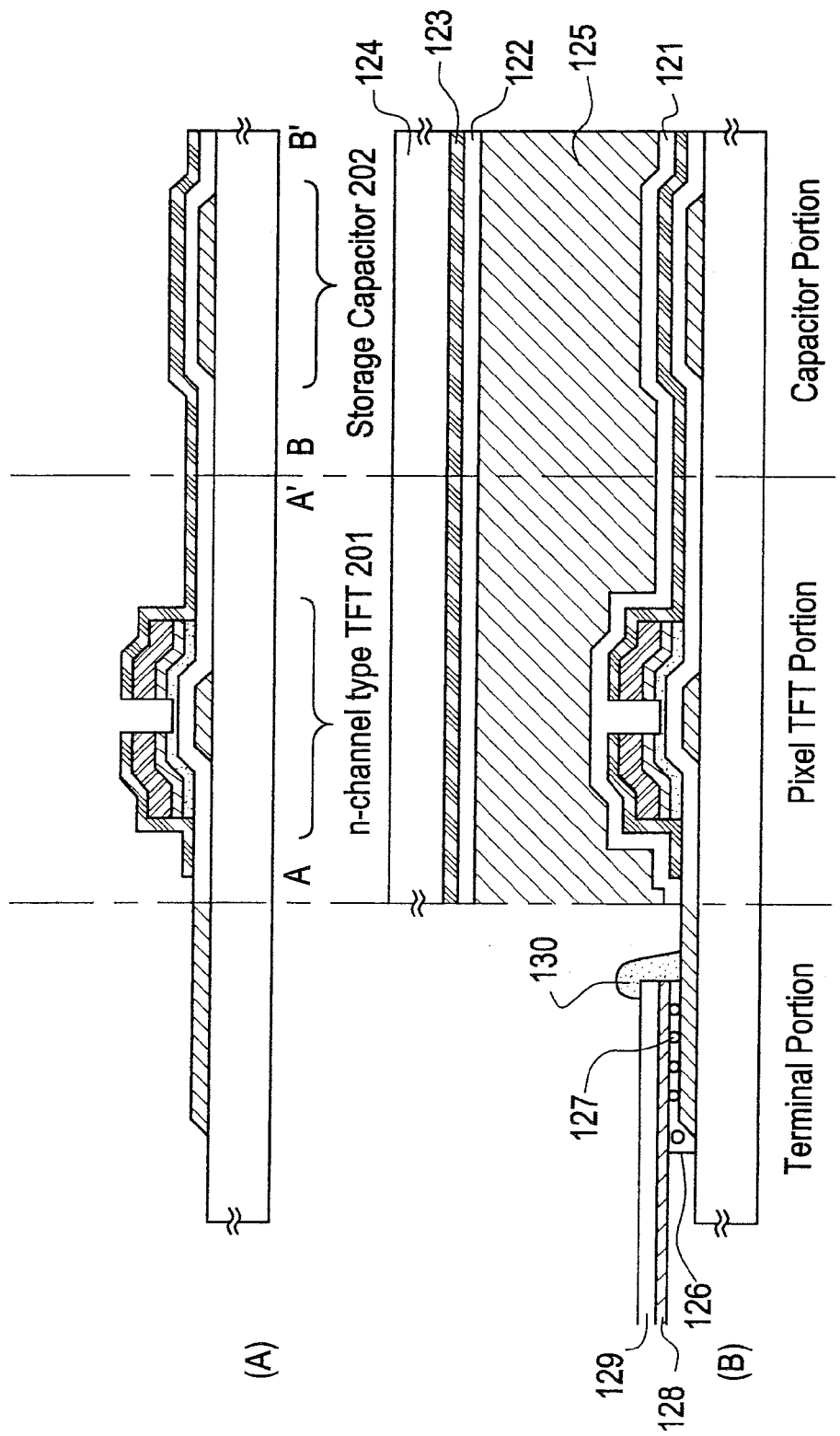
FIG. 3 Sectional views showing the steps of fabricating the AM-LCD.

Also, in each of the above constructions, the semiconductor device is characterized in that, as shown in FIG. 2(D), said source region 115 and said drain region 116 are formed by the same mask as that of said amorphous semiconductor film 114 and said electrode 118. Alternatively, the semiconductor device is characterized in that said source region and said drain region are formed by the same mask as that of said source wiring 117.

Also, in each of the above constructions, the semiconductor device is characterized in that, as shown in FIG. 2(D), said source region 115 and said drain region 116 are formed by the same mask as that of said source wiring 117 and said pixel electrode 119.

Also, in each of the above constructions, owing to an etching step in FIG. 2(D), the semiconductor device has a construction where film thicknesses in those regions of said amorphous semiconductor film which are contiguous to said source region and said drain region are greater than a film thickness in that region of said amorphous semiconductor film which lies between the region contiguous to said source region and the region contiguous to said drain region; that is, a bottom gate structure of channel etching type.

Besides, the construction of an invention for realizing the above structure consists in:

a method of fabricating a semiconductor device characterized by comprising:

the first step of forming each gate wiring 102 by employing a first mask;

the second step of forming an insulating film 104 which covers the gate wiring;

the third step of forming a first amorphous semiconductor film 105 on said insulating film;

the fourth step of forming a second amorphous semiconductor film 106 which contains an impurity element bestowing the n-type, on said first amorphous semiconductor film;

the fifth step of forming a first electrically-conductive film 107 on said second amorphous semiconductor film;

the sixth step of forming a wiring 111 (source wiring and electrode) in such a way that said first amorphous semiconductor film, said second amorphous semiconductor film and the first conductive film are selectively removed by employing a second mask;

the seventh step of forming a second electrically-conductive film 112 which overlies said wiring 111 (source wiring and electrode) and said electrode in touch with them; and the eighth step of forming a source region 115 and a drain region 116 made of said second amorphous semiconductor film, and a pixel electrode 119 made of the second conductive film, in such a way that part of said first amorphous semiconductor film 109, said second amorphous semiconductor film 110, said first conductive film 111 and said second conductive film 112 are selectively removed by employing a third mask.

Also, in the above construction, the method is characterized in that said second step through said fifth step are performed successively without exposure to the atmospheric air.

Also, in each of the above constructions, the method is characterized in that said second step through said fifth step are performed successively within an identical chamber.

Also, in each of the above constructions, said insulating film may well be formed by a sputtering process or a plasma CVD process.

Also, in each of the above constructions, said first amorphous semiconductor film may well be formed by a sputtering process or a plasma CVD process.

Also, in each of the above constructions, said second amorphous semiconductor film may well be formed by a sputtering process or a plasma CVD process.

Also, in each of the above constructions, the method is characterized in that said second conductive film is a transparent electrically-conductive film or an electrically-conductive film having a reflectivity.

MODES FOR CARRYING OUT THE INVENTION

Modes for carrying out the invention of the present application will be described below.

FIG. 1 exemplifies a plan view of an active matrix substrate in the present invention, and the construction of one of a plurality of pixels arranged in the shape of a matrix is illustrated here for the sake of brevity.

As shown in FIG. 1, the active matrix substrate has a plurality of gate wirings which are laid in parallel with one another, and a plurality of source wirings which intersect orthogonally to the individual gate wirings.

Besides, a pixel electrode 119 made of a transparent electrically-conductive film is located in a region which is surrounded with the gate wirings and the source wirings. In addition, a transparent electrically-conductive film 120 covers the source wiring so as not to overlap the pixel electrode 119.

Further, a capacitor wiring 103 is laid between the two gate wirings adjoining below the pixel electrode 119, and in parallel with the gate wirings 102. The capacitor wiring 103 is disposed for each of all the pixels, and it forms a retention capacitor with a dielectric being an insulating film which exists between it and the pixel electrode 119.

Besides, a TFT as a switching element is disposed in the vicinity of the intersection part between the gate wiring 102 and the source wiring 117. The TFT is one of inverse stagger type (or bottom gate type) which includes a channel forming region formed of a semiconductor film having an amorphous structure (hereinbelow, called "amorphous semiconductor film").

In addition, the TFT is such that a gate electrode (formed integrally with the gate wiring 102), a gate insulating film, an a-Si film, a source region as well as a drain region made of an n$^+$a-Si film, and a electrode (formed integrally with the source wiring 117) as well as an electrode 118 (hereinbelow, also called "drain electrode") are successively stacked and formed on the insulating substrate.

Also, a gate insulating film, an a-Si film and an n$^+$a-Si film are successively stacked and formed on the insulating substrate, under the source wiring (including the electrode) as well as the drain electrode 118.

Also, that region of the a-Si film which lies between the region thereof contiguous to the source region and the region thereof contiguous to the drain region has a smaller film thickness as compared with the other region thereof. The smaller film thickness is grounded on the fact that, in forming the source region and the drain region by separating the n$^+$a-Si film by etching, the part of the a-Si film has been removed. Moreover, the end face of the pixel electrode, that of the drain wiring and that of the drain region lie in register owing to the etching. Likewise, the end face of the transparent conductive film covering the electrode, that of the source region and that of the source wiring lie in register.

The invention of the present application constructed as stated above will be described in more detail in connection with embodiments given below.

EMBODIMENTS OF THE INVENTION

Embodiment 1

An embodiment of the invention is explained using FIGS. 1 to 6. Embodiment 1 shows a method of manufacturing a liquid crystal display device, and a detailed explanation of a method of forming a TFT of a pixel portion on a substrate by a reverse stagger type TFT, and manufacturing a storage capacitor connected to the TFT, is made in accordance with the processes used. Further, a manufacturing process for a terminal section, formed in an edge portion of the substrate, and for electrically connecting to wirings of circuits formed on the other substrate, is shown at the same time in the same figures.

In FIG. 2(A), a glass substrate, comprising such as barium borosilicate glass or aluminum borosilicate glass, typically Corning Corp. #7059 or #1737, can be used as a substrate 100 having translucency. In addition, a translucent substrate such as a quartz substrate or a plastic substrate can also be used.

Next, after forming a conductive layer over the entire surface of the substrate, a first photolithography process is performed, a resist mask is formed, unnecessary portions are removed by etching, and wirings and electrodes (the gate wiring 102 including a gate electrode, a capacitor wiring 103 and a terminal 101) are formed. Etching is performed at this time to form a tapered portion in at least an edge portion of the gate electrode 102. A top view of this stage is shown in FIG. 4.

It is preferable to form the gate wiring 102 including the gate electrode, the capacitor wiring 103, and the edge portion terminal 101 from a low resistivity conductive material such as aluminum (Al), but simple Al has problems such as inferior heat resistance and easily corrodes, etc., and therefore it is formed in combination with a heat resistant conductive material. One element selected from the group consisting of titanium (Ti), tantalum (Ta), tungsten (W), molybdenum (Mo), chromium (Cr), neodymium (Nd), or an alloy comprising the above elements, or an alloy film of a combination of the above elements, or a nitrated compound comprising the above elements is formed as the heat resistant conductive material. Furthermore, forming in combination with a heat resistant conductive material such as Ti, Si, Cr, or Nd, it is preferable because of improved levelness. Further, only such heat resistant conductive material may also be formed, for example, combination of Mo and W may be formed.

In realizing the liquid crystal display device, it is preferable to form the gate electrode and the gate wiring by a combination of a heat resistant conductive material and a low resistivity conductive material. An appropriate combination in this case is explained.

Provided that the screen size is on the order of, or less than, 5 inch diagonal type, a two layer structure of a lamination of a conductive layer (A) made from a nitride compound of a heat resistant conductive material, and a conductive layer (B) made from a heat resistant conductive material is used. The conductive layer (B) may be formed from an element selected from the group consisting of Al, Ta, Ti, W, Nd, and Cr, or from an alloy of the above elements, or from an alloy film of a combination of the above elements, and the conductive layer (A) is formed from a film such as a tantalum nitride (TaN) film, a tungsten nitride (WN) film, or a titanium nitride (TiN) film. For example, it is preferable to use a double layer structure of a lamination of Cr as the conductive layer (A) and Al containing Nd as the conductive layer (B). The conductive layer (A) is given a thickness of 10 to 100 nm (preferably between 20 and 50 nm), and the conductive layer (B) is made with a thickness of 200 to 400 nm (preferably between 250 and 350 nm).

On the other hand, in order to be applied to a large screen, it is preferable to use a three layer structure of a lamination of a conductive layer (A) made from a heat resistant conductive material, a conductive layer (B) made from a low resistivity conductive material, and a conductive layer (C) made from a heat resistant conductive material. The conductive layer (B) made from the low resistivity conductive material is formed from a material comprising aluminum (Al), and in addition to pure Al, Al containing between 0.01 and 5 atomic % of an element such as scandium (Sc), Ti, Nd, or silicon (Si) is used. The conductive layer (C) is effective in preventing generation of hillocks in the Al of the conductive layer (B). The conductive layer (A) is given a thickness of 10 to 100 nm (preferably between 20 and 50 nm), the conductive layer (B) is made from 200 to 400 nm thick (preferable between 250 and 350 nm), and the conductive layer (C) is from 10 to 100 nm thick (preferably between 20 and 50 nm). In Embodiment 1, the conductive layer (A) is formed from a Ti film with a thickness of 50 nm, made by sputtering with a Ti target, the conductive layer (B) is formed from an Al film with a thickness of 200 nm, made by sputtering with an Al target, and the conductive layer (C) is formed from a 50 nm thick Ti film, made by sputtering with a Ti target.

An insulating film 104 is formed next on the entire surface. The insulating film 104 is formed using sputtering, and has a film thickness of 50 to 200 nm.

For example, a silicon oxynitride film is used as the insulating film 104, and formed to a thickness of 150 nm. Of course, the gate insulating film is not limited to this type of silicon oxynitride film, and another insulating film such as a silicon oxide film, a silicon nitride film, or a tantalum oxide film may also be used, and the gate insulating film may be formed from a single layer or a lamination structure made from these materials. For example, a lamination structure having a silicon nitride film as a lower layer and a silicon oxide film as an upper layer may be used.

Next, an amorphous semiconductor film 105 is formed with a thickness of 50 to 200 nm (preferably between 100 and 150 nm) on the insulating film 104 over the entire surface by using a known method such as plasma CVD or sputtering (not shown in the figure). Typically, a hydrogenated amorphous silicon (a-Si:H) film is formed with a thickness of 100 nm by sputtering. In addition, it is also possible to apply a microcrystalline semiconductor film, or a compound semiconductor film having an amorphous structure, such as an amorphous silicon germanium film, etc., as the amorphous semiconductor film.

An amorphous semiconductor film 106 which contains an impurity element imparting n-type is formed next with a thickness of 20 to 80 nm, as a semiconductor film containing impurity element of one conductivity type 106. The amorphous semiconductor film which contains an impurity element imparting n-type 106 is formed on the entire surface by a known method such as plasma CVD or sputtering. Typically an $n^+$a-Si:H film may be formed, and the film is deposited by using a target added with phosphorus (P) for that purpose. Alternatively, the amorphous semiconductor film containing an n-type impurity element 106 may also be formed from a hydrogenated microcrystalline silicon film (μc-Si:H).

Next, a conductive metal film 107 is formed by sputtering or vacuum evaporation. Provided that ohmic contact with the $n^+$a-Si:H film 106 can be made, there are no particular limitation on the material of the conductive metal film 107, and an element selected from the group consisting of Al, Cr, Ta, and Ti, or an alloy comprising the above elements, and an alloy film of a combination of the above elements or the like can be given. Sputtering is used in Embodiment 1, and a 50 to 150 nm thick Ti film, an aluminum (Al) film with a thickness between 300 and 400 nm above the Ti film, and a Ti film with a thickness of 100 to 150 nm thereon are formed as the metal film 107. (See FIG. 2A.)

The insulating film 104, the amorphous semiconductor film 105, the amorphous semiconductor film 106 containing an impurity element which imparts one conductivity type, and the conductive metal film 107 are all manufactured by a known method, and can be manufactured by plasma CVD or sputtering. These films are formed in succession by sputtering, and suitably changing the target or the sputtering gas in Embodiment 1. The same reaction chamber, or a plurality of reaction chambers, in the sputtering apparatus is used at this time, and it is preferable to laminate these films in succession without exposure to the atmosphere. By thus not exposing the films to the atmosphere, the mixing in of impurities can be prevented.

Next, a second photolithography process is then performed, a resist mask 108 is formed, and by removing unnecessary portions by etching, wiring and electrodes (source wiring) are formed. Wet etching or dry etching is used as the etching process at this time. The amorphous semiconductor film 105, the semiconductor film 106 containing an impurity element which imparts one conductivity type and the conductive metal film 107 are etched, and an amorphous semiconductor film 109, a semiconductor film 110 containing an impurity element which imparts one conductivity type and a conductive metal film 111 are formed in the pixel TFT portion. Further, the capacitor wiring 103 and the insulating film 104 remain in a capacitor portion, and the terminal 101 and the insulating film 104 also remain similarly in a terminal portion. In Embodiment 1, the metal film 107 in which the Ti film, the Al film, and the Ti film are laminated in order is etched by dry etching using a gas mixture of $SiCl_4$, $Cl_2$, and $BCl_3$ as a reaction gas, and the reaction gas is substituted with a gas mixture of $CF_4$ and $O_2$, and the amorphous semiconductor film 105 and the semiconductor film 106 containing the impurity element for imparting one conductivity type, are removed. (See FIG. 2B.)

Figure 5:
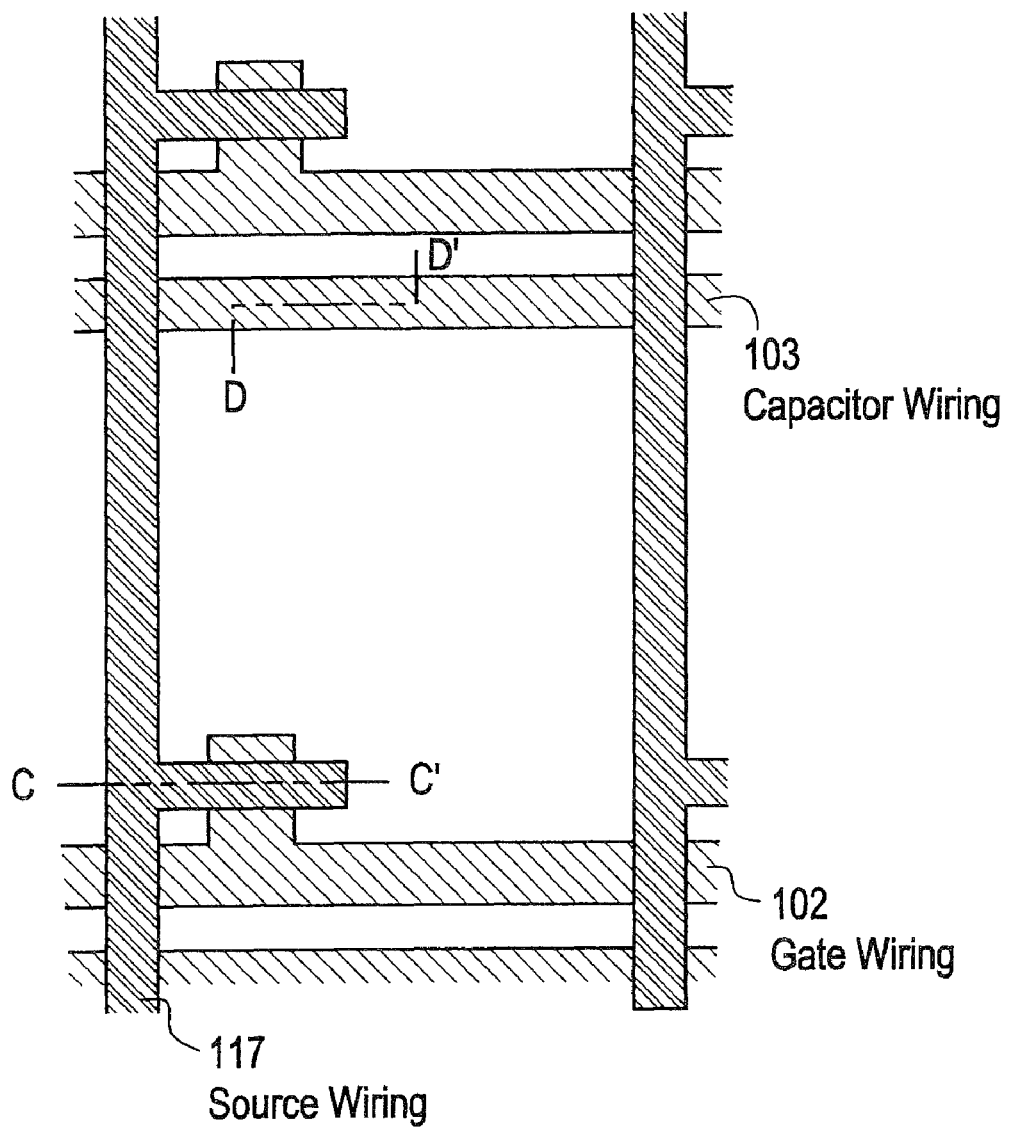
FIG. 5 Top plan views showing the steps of fabricating the AM-LCD.

Next, after removing the resist mask 108, a transparent conductive film 112 is deposited on the entire surface. (FIG. 2C) The top view at this time is shown in FIG. 5. Note that the transparent conductive film 112 deposited on the entire surface is not shown in FIG. 5 for simplification.

This transparent conductive film 112 is formed from a material such as indium oxide ($In_2O_3$) or indium oxide tin oxide alloy ($In_2O_3$—$SnO_2$, abbreviated as ITO) using a method such as sputtering or vacuum evaporation. The etching process for this type of material is performed using a solution of hydrochloric acid type. However, a residue is easily generated, particularly by ITO etching, and therefore an indium oxide zinc oxide alloy ($In_2O_3$—$ZnO$) may be used in order to improve the etching workability. The indium oxide zinc oxide alloy has superior surface smoothing characteristics, and has superior thermal stability compared to ITO, and therefore even if the electrode 111 is made from an Al film, a corrosion reaction can be prevented. Similarly, zinc oxide (ZnO) is also a suitable material, and in addition, in order to increase the transmissivity of visible light and increase the conductivity, a material such as zinc oxide in which gallium (Ga) is added (ZnO:Ga) can be used.

Resist mask 113 is formed next by a third photolithography process. Unnecessary portions are then removed by etching, forming an amorphous semiconductor film 114, a source region 115, a drain region 116, the source electrode 117, the drain electrode 118, and the pixel electrode 119. (See FIG. 2D.)

The third photolithography process patterns the transparent conductive film, and at the same time removes a part of the conductive metal film 111, the $n^+$a-Si film 110 and the amorphous semiconductor film 109 by etching, forming an opening. In Embodiment 1, the pixel electrode made from ITO is selectively removed first by wet etching using a mixed solution of nitric acid and hydrochloric acid, or a ferric chloride solution, and a portion of the conductive metal film 111, the $n^+$a-Si film 110 and the amorphous semiconductor film 109 are etched by dry etching. Note that wet etching and dry etching are used in Embodiment 1, but the operator may perform only dry etching by suitably selecting the reaction gas, and the operator may perform only wet etching by suitably selecting the reaction solution.

The lower portion of the opening reaches the amorphous semiconductor film, and the amorphous semiconductor film 114 having a concave portion is formed. The conductive metal film 111 is separated into the source wiring 117 and the drain electrode 118 by the opening, and the $n^+$a-Si film 110 is separated into the source region 115 and the drain region 116. Furthermore, the transparent conductive film 120 contacting the source electrode 117 covers the source wiring, and during subsequent manufacturing processes, especially during a rubbing process, fulfills a role of preventing static electricity from developing. An example of forming the transparent conductive film 120 on the source wiring is shown in Embodiment 1, but the transparent conductive film 120 may also be removed during etching of the above stated ITO film. Further, a circuit for protection from static electricity may be formed by utilizing the above ITO film, in the etching of the ITO film.

Moreover, a storage capacitor is formed in the third photolithography process by the capacitor wiring 103 and the pixel electrode 119, with the insulating film 104 in the capacitor portion as a dielectric.

In addition, the transparent conductive film formed in the terminal portion is removed by the third photolithography process.

Next after removing the resist mask 113, a resist mask is formed by using a shadow mask, and the insulating film which covers the terminal 101 of the terminal portion is selectively removed. (FIG. 3A) In addition, the resist mask may also be formed by screen printing in place of the shadow mask. Note that FIG. 1 is a top view of one pixel, and FIG. 3A corresponds to cross sections taken along the lines A-A' and B-B'.

By thus using three photomasks and performing three photolithography processes, the pixel TFT portion having the reverse stagger type n-channel TFT 201 and the storage capacitor 202 can be completed. By placing these in a matrix state corresponding to each pixel and thus composing the pixel portion, one substrate can be made in order to manufacture an active matrix liquid crystal display device. For convenience, this type of substrate is referred to as an active matrix substrate throughout this specification.

An alignment film 121 is selectively formed next in only the pixel portion of the active matrix substrate. Screen printing may be used as a method of selectively forming the alignment film 121, and a method of removal in which a resist mask is formed using a shadow mask after application of the alignment film may also be used. Normally, a polyimide resin is often used in the alignment film of the liquid crystal display element. Note that though the present Embodiment showed an example of forming the alignment film after selectively removing the insulating film which covers the terminal 101 of the terminal portion, the insulating film and the alignment film in the terminal portion may be removed at the same time after laminating the alignment film on the insulating film which covers the terminal 101 of the terminal portion.

Next, a rubbing process is then performed on the alignment film 121, orienting the liquid crystal elements so as to possess a certain fixed pre-tilt angle.

The active matrix substrate, and an opposing substrate 124 on which an opposing electrode 122 and an alignment film 123 are formed, are next joined together by a sealant while maintaining a gap between the substrates using spacers, after which a liquid crystal material 125 is injected into the space between the active matrix substrate and the opposing substrate. A known material may be applied for the liquid crystal material 125, and a TN liquid crystal is typically used. After injecting the liquid crystal material, the injecting entrance is sealed by a resin material.

Next, a flexible printed circuit (FPC) is connected to the terminal 101 of the terminal portion. The FPC is formed by a copper wiring 128 on an organic resin film 129 such as polyimide, and is connected to the input terminal 502 by an anisotropic conductive adhesive. The anisotropic conductive adhesive comprises an adhesive 126 and particles 127, with a diameter of several tens to several hundred of μm and having a conductive surface plated by a material such as gold, which are mixed therein. The particles 127 form an electrical connection in this portion by connecting the input terminal 101 and the copper wiring 128. In addition, in order to increase the mechanical strength of this region, a resin layer 130 is formed. (See FIG. 3B.)

Figure 6:
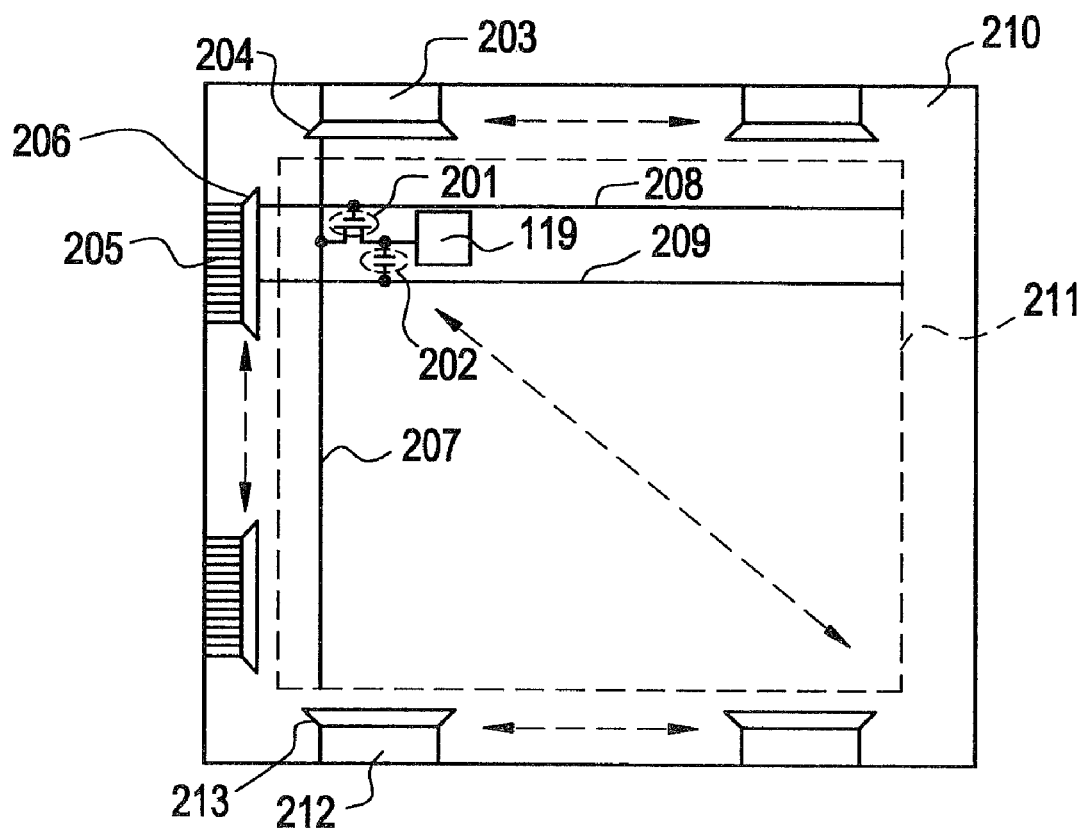
FIG. 6 Top plan view for explaining the arrangement of the pixel portions and input terminal portions of the liquid crystal display device.

FIG. 6 is a diagram explaining the placement of the pixel portion and the terminal portion of the active matrix substrate. A pixel portion 211 is formed on a substrate 210, gate wirings 208 and source wirings 207 are formed intersecting on the pixel portion, and the n-channel TFT 201 connected to this is formed corresponding to each pixel. The pixel electrode 119 and a storage capacitor 202 are connected to the drain side of the n-channel TFT 201, and the other terminal of the storage capacitor 202 is connected to a capacitor wiring 209. The structure of the n-channel TFT 201 and the storage capacitor 202 is the same as that of the n-channel TFT 201 and the storage capacitor 202 shown by FIG. 3A.

An input terminal portion 205 for inputting a scanning signal is formed in one edge portion of the substrate, and is connected to a gate wiring 208 by a connection wiring 206.

Further, an input terminal portion 203 for inputting an image signal is formed in the other edge portion, and is connected to a source wiring 207 by a connection wiring 204. A plurality of the gate wiring 208, the source wiring 207, and the capacitor wiring 209 are formed in accordance with the pixel density, and their number are as described above. Furthermore, an input terminal portion 212 for inputting an image signal and a connection wiring 213 may be formed, and may be connected to the source wiring alternately with the input terminal portion 203. An arbitrary number of the input terminal portions 203, 205, and 212 are formed, which may be suitably determined by the operator.

Embodiment 2

Figure 7:
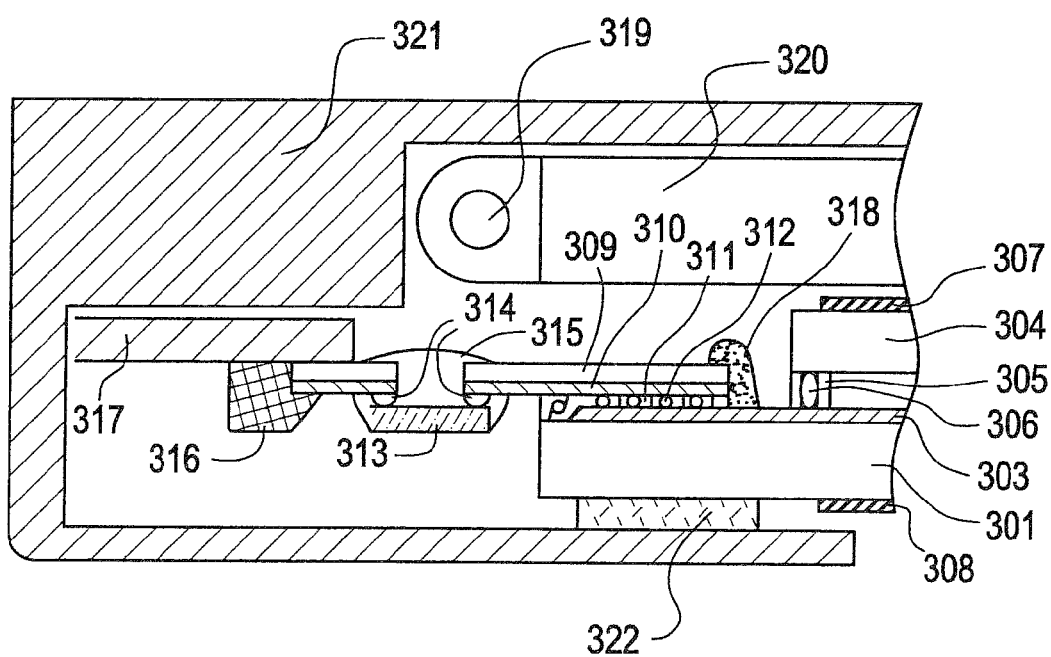
FIG. 7 Sectional view showing the packaging structure of a liquid crystal display device.

FIG. 7 is an example of a method of mounting a liquid crystal display device. The liquid crystal display device has an input terminal portion 302 formed in an edge portion of a substrate 301 on which TFTs are formed, and as shown by embodiment 1, this is formed by a terminal 303 formed from the same material as a gate wiring. An opposing substrate 304 is joined to the substrate 301 by a sealant 305 encapsulating spacers 306, and in addition, polarizing plates 307 and 308 are formed. This is then fixed to a casing 321 by spacers 322.

Note that the TFT obtained in Embodiment 1 having an active layer formed by an amorphous semiconductor film has a low electric field effect mobility, and only approximately 1 $cm^2/Vsec$ is obtained. Therefore, a driver circuit for performing image display is formed by a LSI chip, and mounted by a TAB (tape automated bonding) method or by a COG (chip on glass) method. In Embodiment 2, an example is shown of forming the driver circuit in a LSI chip 313, and mounting by using the TAB method. A flexible printed circuit (FPC) is used, and the FPC is formed by a copper wiring 310 on an organic resin film 309, such as polyimide, and is connected to the input terminal 302 by an anisotropic conductive adhesive. The anisotropic conductive adhesive is structured by an adhesive 311 and particles 312, with a diameter of several tens to several hundred of μm and having a conductive surface plated by a material such as gold, which are mixed therein. The particles 312 form an electrical connection in this portion by connecting the input terminal 302 and the copper wiring 310. In addition, in order to increase the mechanical strength of this region, a resin layer 318 is formed.

The LSI chip 313 is connected to the copper wiring 310 by a bump 314, and is sealed by a resin material 315. The copper wiring 310 is then connected to a printed substrate 317 on which other circuits such as a signal processing circuit, an amplifying circuit, and a power supply circuit are formed, through a connecting terminal 316. A light source 319 and a light conductor 320 are formed on the opposing substrate 304 and used as a back light in the transmission type liquid crystal display device.

Embodiment 3

In Embodiment 1 an example centering on forming lamination of an insulating film, an amorphous semiconductor film, an amorphous semiconductor film containing an impurity element which imparts n-type conductivity, and a metal film by sputtering, but Embodiment 3 shows an example of using plasma CVD to form the films.

The insulating film, the amorphous semiconductor film, and the amorphous semiconductor film containing an impurity element which imparts n-type conductivity are formed by plasma CVD in Embodiment 3.

In Embodiment 3, a silicon oxynitride film is used as the insulating film, and formed with a thickness of 150 nm by plasma CVD. Plasma CVD may be performed at this point with a power supply frequency of 13 to 70 MHz, preferably between 27 and 60 MHz. By using a power supply frequency of 27 to 60 MHz, a dense insulating film can be formed, and the voltage resistance can be increased as a gate insulating film. Further, a silicon oxynitride film manufactured by adding $O_2$ to $SiH_4$ and $N_2O$ has a reduction in fixed electric charge density in the film, and therefore is a material which is preferable for this use. Of course, the gate insulating film is not limited to this type of silicon oxynitride film, and a single layer or a lamination structure using other insulating films such as s silicon oxide film, a silicon nitride film, or a tantalum nitride film may be formed. Further, a lamination structure of a silicon nitride film in a lower layer, and a silicon oxide film in an upper layer may be used.

For example, when using a silicon oxide film, it can be formed by plasma CVD using a mixture of tetraethyl orthosilicate (TEOS) and $O_2$, with the reaction pressure set to 40 Pa, a substrate temperature of 250 to 350° C., and discharge at a high frequency (13.56 MHz) power density of 0.5 to 0.8 $W/cm^2$. Good characteristics as the gate insulating film can be obtained for the silicon oxide film thus formed by a subsequent thermal anneal at 300 to 400° C.

Typically, a hydrogenated amorphous silicon (a-Si:H) film is formed with a thickness of 100 nm by plasma CVD as the amorphous semiconductor film. At this point, plasma CVD may be performed with a power supply frequency of 13 to 70 MHz, preferably between 27 and 60 MHz, in the plasma CVD apparatus. By using a power frequency of 27 to 60 MHz, it becomes possible to increase the film deposition speed, and the deposited film is preferable because it becomes an a-Si film having a low defect density. In addition, it is also possible to apply a microcrystalline semiconductor film and a compound semiconductor film having an amorphous structure, such as an amorphous silicon germanium film, as the amorphous semiconductor film.

Further, if 100 to 100 k Hz pulse modulation discharge is performed in the plasma CVD film deposition of the insulating film and the amorphous semiconductor film, then particle generation due to the plasma CVD gas phase reaction can be prevented, and pinhole generation in the formed film can also be prevented, and therefore is preferable.

Further, in Embodiment 3 an amorphous semiconductor film containing an impurity element which imparts n-type conductivity is formed with a thickness of 20 to 80 nm as a semiconductor film containing a single conductivity type impurity element. For example, an a-Si:H film containing an n-type impurity element may be formed, and in order to do so, phosphine ($PH_3$) is added at a 0.1 to 5% concentration to silane ($SiH_4$). Alternatively, a hydrogenated microcrystalline silicon film (μc-Si:H) may also be used as a substitute for the amorphous semiconductor film 106, containing an impurity element which imparts n-type conductivity.

These films can be formed in succession by appropriately changing the reaction gas. Further, these films can be laminated successively without exposure to the atmosphere at this time by using the same reaction chamber or a plurality of reaction chambers in the plasma CVD apparatus. By thus depositing successively these films without exposing the films to the atmosphere, the mixing in of impurities into the first amorphous semiconductor film can be prevented.

Note that it is possible to combine Embodiment 4 with Embodiment 2.

Embodiment 4

In Embodiment 4, an example of forming a protecting film is shown in FIG. 6. Note that Embodiment 4 is identical to Embodiment 1 through the state of FIG. 2D, and therefore only points of difference are explained. Further, the same symbols are used for locations corresponding to those in FIG. 2D.

After first obtaining the state of FIG. 2D in accordance with Embodiment 1, a thin inorganic insulating film is formed on the entire surface. As the thin inorganic insulating film, a single layer or a laminate structure may be formed by using inorganic insulating films such as a silicon oxide film, a silicon nitride film, a silicon oxynitride film or a tantalum oxide film.

A forth photolithography process is performed next, forming a resist mask, and unnecessary portions are removed by etching, forming an insulating film 401 in the pixel TFT portion, and an inorganic insulating film 402 in the terminal portion. These inorganic insulating films 401 and 402 function as passivation films. Further, in the terminal portion, the thin inorganic insulating film 402 and the inorganic insulating film 104 are removed at the same time by the fourth lithography process, and the terminal 101 of the terminal portion can be exposed.

The reverse stagger type n-channel type TFT and the storage capacitor, protected by the inorganic insulating film, can thus be completed in Embodiment 4 by performing the photolithography process using four photomasks four times in total. By thus structuring the pixel portion by arranging these into a matrix state corresponding to each pixel, one substrate for manufacturing the active matrix electro-optical device can be made.

Note that it is possible to freely combine the constitution of Embodiment 4 with any one of constitutions of Embodiments 1 to 3.

Embodiment 5

Whereas the method of fabricating the active matrix substrate which corresponds to the liquid crystal display device of transmission type has been mentioned in Embodiment 1, an example which corresponds to a liquid crystal display device of reflection type will be mentioned in this embodiment.

First, up to the steps shown in FIG. 2(B) are carried out in the same way as in Embodiment 1. Besides, an electrically-conductive film having a reflectivity (of Al, Ag or the like) is formed instead of the transparent electrically-conductive film. Besides, a resist mask pattern is formed by the third photolithographic step in the same way as in Embodiment 1, and a pixel electrode made of the reflective conductive film is formed by etching. The pixel electrode is formed so as to overlap the electrode 118.

The subsequent steps are similar to those of Embodiment 1, and shall therefore be omitted from description. In this way, the active matrix substrate corresponding to the reflection type liquid crystal display device can be fabricated using three photo-masks by the three photolithographic steps.

It is also possible to combine this embodiment with Embodiment 4.

Embodiment 6

CMOS circuits and pixel portion formed by implementing the present invention can be used in various electro-optical devices (such as an active matrix liquid crystal display device and an active matrix EC display device). Namely, the present invention can be implemented in all electronic appliances in which these electro-optical devices are built into a display portion.

The following can be given as such electronic appliance: a video camera, a digital camera, a projector (rear type or front type), a head-mounted display (goggle type display), a car navigation system, a car stereo, a personal computer, and a portable information terminal (such as a mobile computer, a portable telephone or an electronic book). Examples of these are shown in FIGS. 9, 10 and 11.

Figure 9A:
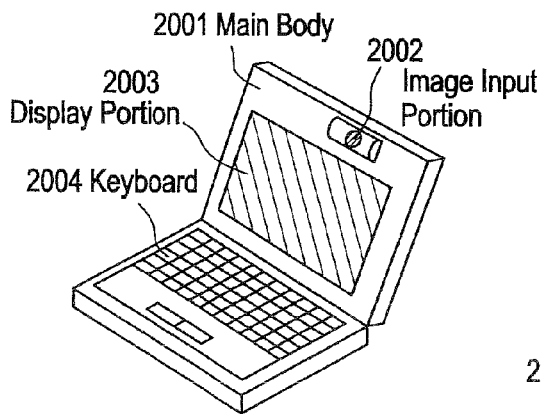
FIG. 9 Views showing examples of electronic equipment.

FIG. 9A is a personal computer, and it includes a main body 2001, an image input portion 2002, a display portion 2003, and a keyboard 2004, etc. The present invention can be applied to the image input portion 2002, the display portion 2003 or other signal driver circuits.

Figure 9B:
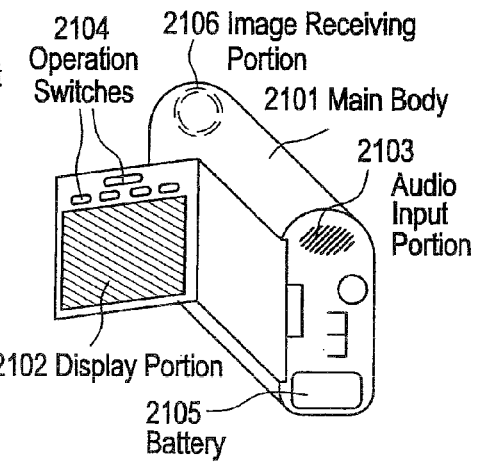

FIG. 9B is a video camera, and it includes a main body 2101, a display portion 2102, an audio input portion 2103, operation switches 2104, a battery 2105, and an image receiving portion 2106, etc. The present invention can be applied to the display portion 2102 or other signal driver circuits.

Figure 9C:
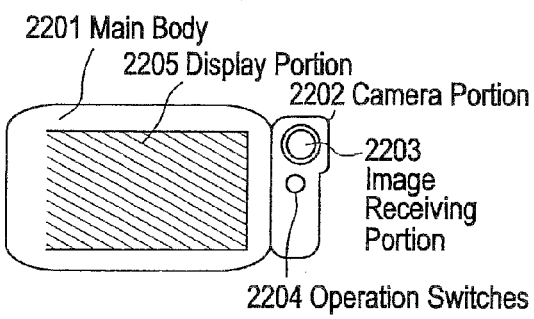

FIG. 9C is a mobile computer, and it includes a main body 2201, a camera portion 2202, an image receiving portion 2203, operation switches 2204, and a display portion 2205. The present invention can be applied to the display portion 2205 or other signal driver circuits.

Figure 9D:
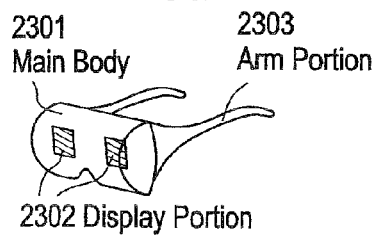

FIG. 9D is a goggle type display, and it includes a main body 2301, a display portion 2302, an arm portion 2303, etc. The present invention can be applied to the display portion 2302 or other signal driver circuits.

Figure 9E:
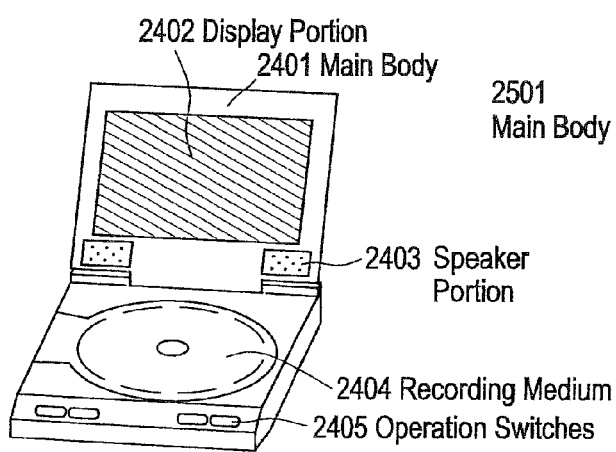

FIG. 9E is a player that uses a recording medium on which a program is recorded (hereafter referred to as a recording medium), and the player includes a main body 2401, a display portion 2402, a speaker portion 2403, a recording medium 2404, and operation switches 2405, etc. Note that this player uses a recording medium such as a DVD (digital versatile disk) or a CD, and the appreciation of music, the appreciation of film, game playing and the Internet can be performed. The present invention can be applied to the display portion 2402 or other signal driver circuits.

Figure 9F:
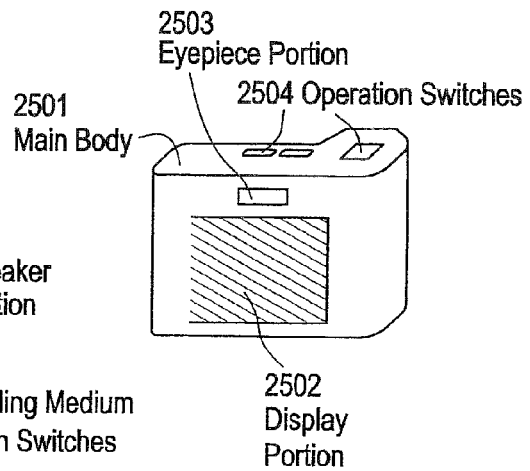

FIG. 9F is a digital camera, and it includes a main body 2501, a display portion 2502, an eyepiece portion 2503, operation switches 2504, and an image receiving portion (not shown in the figure), etc. The present invention can be applied to the display portion 2502 or other signal driver circuits.

Figure 10A:
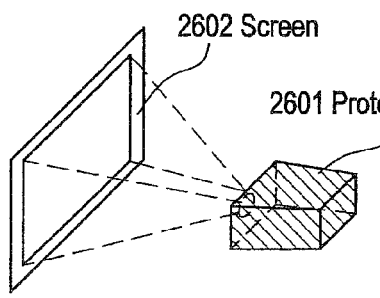
FIG. 10 Views showing examples of electronic equipment.

FIG. 10A is a front projector, and it includes a projection system 2601, a screen 2602, etc. The present invention can be applied to a liquid crystal display device 2808 which constitutes a part of the projection system 2601, or other signal driver circuits.

Figure 10B:
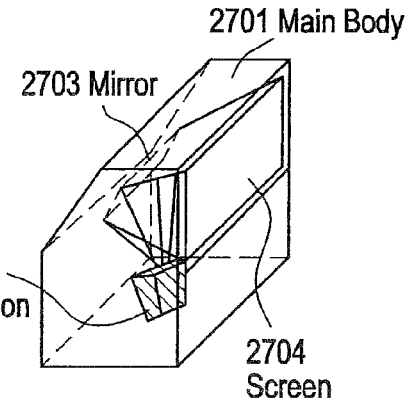

FIG. 10B is a rear projector, and it includes a main body 2701, a projection system 2702, a mirror 2703, a screen 2704, etc. The present invention can be applied to a liquid crystal display device 2808 which constitutes a part of the projection system 2702 or other signal driver circuits.

Figure 10C:
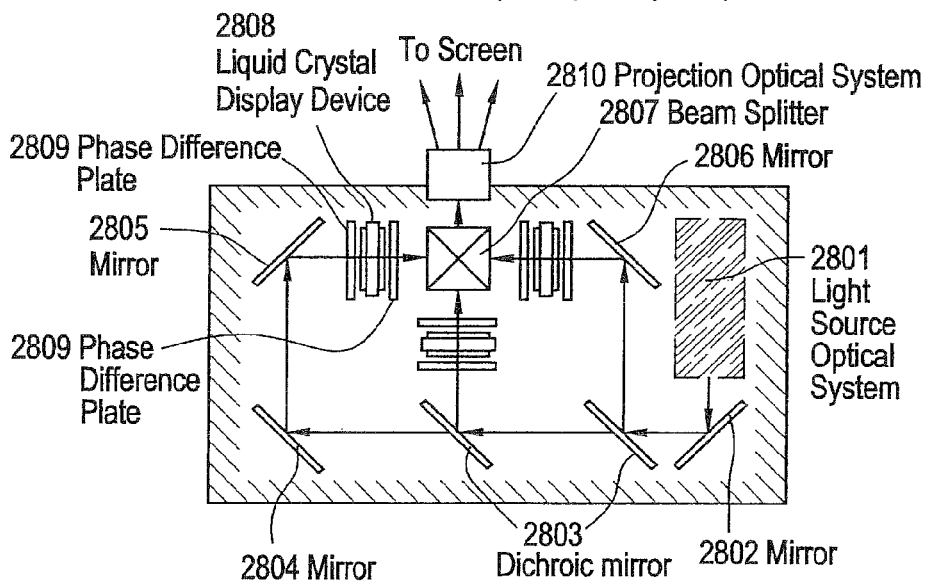

Note that FIG. 10C is a diagram showing an example of the structure of projection systems 2601 and 2702 of FIGS. 10A and 10B. The projection systems 2601 and 2702 comprise an optical light source system 2801, mirrors 2802 and 2804 to 2806, a dichroic mirror 2803, a prism 2807, a liquid crystal display device 2808, phase differentiating plate 2809 and a projection optical system 2810. The projection optical system 2810 comprises an optical system including a projection lens. The present Embodiment showed a three plate type, but it is not limited to this structure, and it may be for instance a single plate type. Further, the operator may appropriately dispose an optical system such as an optical lens, a film having light polarizing function, a film for adjusting phase difference and an IR film, in the optical path shown by an arrow in the FIG. 10C.

Figure 10D:
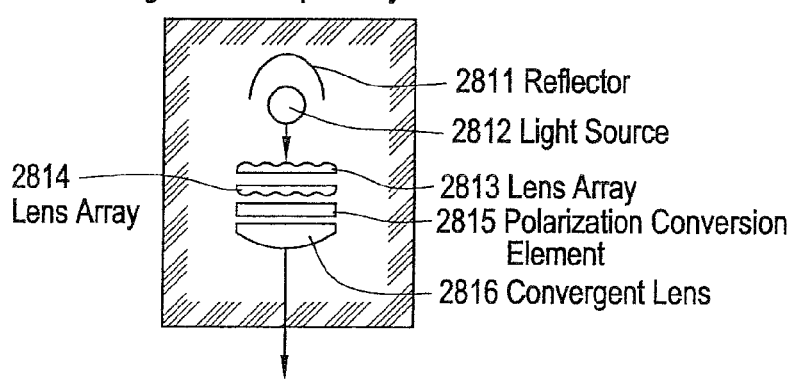

FIG. 10D is a diagram showing an example of the structure of the optical light source system 2801 of FIG. 10C. In the present Embodiment the optical light source system 2801 comprises a reflector 2811, a light source 2812, lens arrays 2813 and 2814, light polarizing conversion element 2815 and a condenser lens 2816. Note that the optical light source system shown in FIG. 10D is merely an example and is not specifically limited. For example, the operator may appropriately dispose an optical system such as an optical lens, a film having light polarizing function, a film for adjusting phase difference and an IR film, etc., in the optical light source system.

Provided however, the projectors shown in FIG. 10 show a case of using transmission type electro-optical device and an application example of reflection type electro-optical device is not shown in the figures.

Figure 11A:
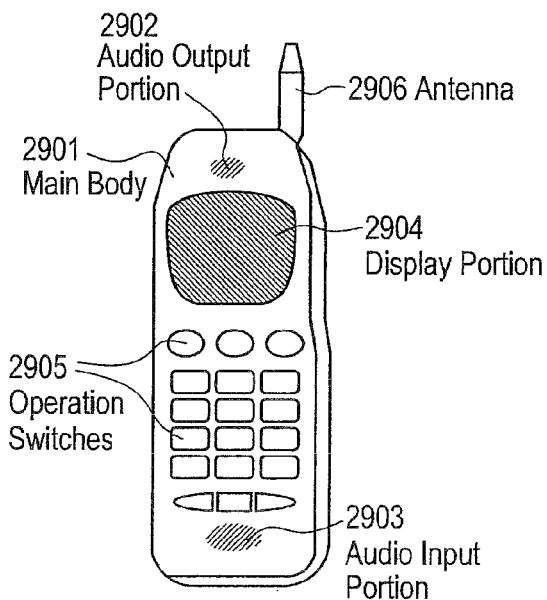
FIG. 11 Views showing examples of electronic equipment.

FIG. 11A is a portable telephone, and it includes a main body 2901, an audio output portion 2902, an audio input portion 2903, a display portion 2904, operation switches 2905, and an antenna 2906, etc. The present invention can be applied to the audio output portion 2902, the audio input portion 2903, the display portion 2904 or other signal driver circuits.

Figure 11B:
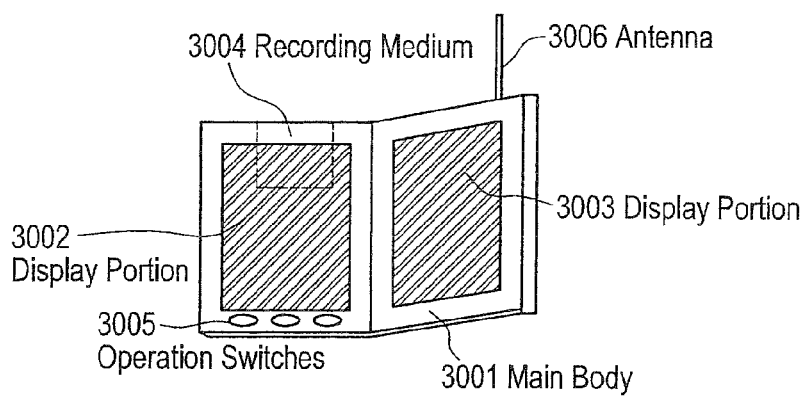

FIG. 11B is a portable book (electronic book), and it includes a main body 3001, display portions 3002 and 3003, a recording medium 3004, operation switches 3005, and an antenna 3006, etc. The present invention can be applied to the display portions 3002 and 3003 or other signal driver circuits.

Figure 11C:
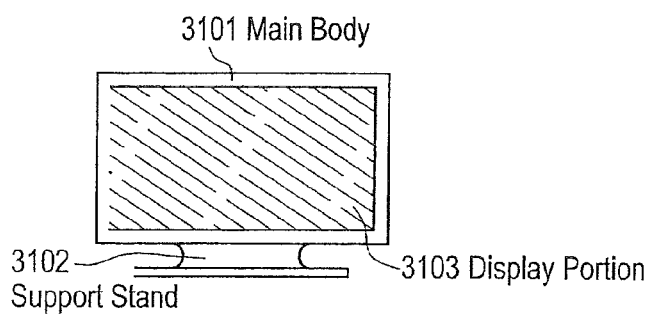

FIG. 11C is a display, and it includes a main body 3101, a support stand 3102, and a display portion 3103, etc. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to electronic appliance in all fields. Further, the electronic appliance of embodiment 6 can be realized by using a constitution of any combination of embodiments 1 to 5.

According to the present invention, a liquid crystal display device which includes a pixel TFT portion having an n-channel TFT of inverse stagger type, and a retention capacitor, can be realized using three photo-masks by three photolithographic steps.

Besides, in case of forming a protective film, a liquid crystal display device which includes a pixel TFT portion having an n-channel TFT of inverse stagger type protected by the inorganic insulating film, and a retention capacitor, can be realized using four photo-masks by four photolithographic steps.

What is claimed is:
1. A display device comprising:
   a thin film transistor, the thin film transistor comprising:
      a gate electrode formed over a substrate;
      an insulating film formed over the gate electrode;
      a semiconductor film formed over the insulating film;
      a source electrode formed over the semiconductor film; and
      a drain electrode formed over the semiconductor film;
   a pixel electrode comprising a transparent conductive material, formed over the substrate, and connected to the drain electrode;
   a source wiring being continuous to the source electrode, formed over the insulating film;
   a gate wiring being continuous to the gate electrode, formed over the substrate;
   a passivation film formed over the source electrode and the drain electrode, the passivation film being in contact with a portion of the semiconductor film between the source electrode and the drain electrode; and
   a capacitor, the capacitor comprising:
      a capacitor wiring formed over the substrate, wherein the capacitor wiring comprises a same material as the gate electrode;
      the insulating film formed over the capacitor wiring; and
      the pixel electrode formed over the capacitor wiring with the insulating film interposed therebetween,
   wherein the capacitor wiring extends substantially in parallel with the gate wiring at least in a pixel portion,
   wherein the capacitor wiring is electrically connected to a terminal portion, and
   wherein the terminal portion is formed in an edge portion of the substrate.

2. The display device according to claim 1, wherein the pixel electrode is located below the passivation film.

3. The display device according to claim 1, wherein an end surface of the pixel electrode lies substantially in register with and an end surface of the drain electrode.

4. The display device according to claim 1, wherein the pixel electrode is in contact with an end surface of the semiconductor film and an end surface of the drain electrode.

5. The display device according to claim 1, further comprising a transparent conductive film formed over and along with the source wiring, comprising the same material as the pixel electrode.

6. The display device according to claim 5, wherein the transparent conductive film extends beyond both side edges of the source wiring.

7. The display device according to claim 5, wherein the transparent conductive film is electrically separated from the pixel electrode.

8. The display device according to claim 5, wherein an end surface of the transparent conductive film lies substantially in register with an end surface of the source electrode.

9. The display device according to claim 5, wherein the transparent conductive film is in contact with an end surface of the semiconductor film and an end surface of the source electrode.

10. The display device according to claim 1, wherein the terminal portion is electrically connected to a flexible printed circuit.

11. The display device according to claim 1, wherein the gate wiring is electrically connected to the terminal portion.

12. The display device according to claim 1, wherein the passivation film comprises at least one of a silicon oxide film, a silicon nitride film, a silicon oxynitride film, and a tantalum oxide film.

13. A display device comprising:
   a thin film transistor, the thin film transistor comprising:
      a gate electrode formed over a substrate;
      an insulating film formed over the gate electrode;
      a first semiconductor film formed over the insulating film;
      a source electrode formed over the first semiconductor film; and
      a drain electrode formed over the first semiconductor film;
   a pixel electrode comprising a transparent conductive material, formed over the substrate, and connected to the drain electrode;
   a source wiring being continuous to the source electrode, formed over the insulating film and a second semiconductor film;

wherein the second semiconductor film is continuous to the first semiconductor film, and comprises the same material as the first semiconductor film, a gate wiring being continuous to the gate electrode, formed over the substrate;

a passivation film formed over the source electrode and the drain electrode, the passivation film being in contact with a portion of the first semiconductor film between the source electrode and the drain electrode; and a capacitor, the capacitor comprising;
   a capacitor wiring formed over the substrate, wherein the capacitor wiring comprises a same material as the gate electrode;
   the insulating film formed over the capacitor wiring; and
   the pixel electrode formed over the capacitor wiring with the insulating film interposed therebetween, wherein the capacitor wiring extends substantially in parallel with the gate wiring at least in a pixel portion, wherein the capacitor wiring is electrically connected to a terminal portion, and wherein the terminal portion is formed in an edge portion of the substrate.

14. The display device according to claim 13, wherein the pixel electrode is located below the passivation film.

15. The display device according to claim 13, wherein an end surface of the pixel electrode lies substantially in register with an end surface of the drain electrode.

16. The display device according to claim 13, wherein the pixel electrode is in contact with an end surface of the first semiconductor film and an end surface of the drain electrode.

17. The display device according to claim 13, further comprising a transparent conductive film formed over and along with the source wiring, comprising the same material as the pixel electrode.

18. The display device according to claim 17, wherein the transparent conductive film extends beyond both side edges of the source wiring.

19. The display device according to claim 17, wherein the transparent conductive film is electrically separated from the pixel electrode.

20. The display device according to claim 17, wherein an end surface of the transparent conductive film lies substantially in register with an end surface of the source electrode.

21. The display device according to claim 17, wherein the transparent conductive film is in contact with an end surface of the first semiconductor film and an end surface of the source electrode.

22. The display device according to claim 13, wherein the terminal portion is electrically connected to a flexible printed circuit.

23. The display device according to claim 13, wherein the gate wiring is electrically connected to the terminal portion.

24. The display device according to claim 13, wherein the passivation film comprises at least one of a silicon oxide film, a silicon nitride film, a silicon oxynitride film, and a tantalum oxide film.

25. A display device comprising:
   a thin film transistor, the thin film transistor comprising:
      a gate electrode formed over a substrate;
      an insulating film formed over the gate electrode;
      a semiconductor film formed over the insulating film;
      a source electrode formed over the semiconductor film; and
      a drain electrode formed over the semiconductor film;
   a pixel electrode comprising a transparent conductive material, formed over the substrate, and connected to the drain electrode;

a source wiring being continuous to the source electrode, formed over the insulating film;

a gate wiring being continuous to the gate electrode, formed over the substrate;

a passivation film formed over the source electrode and the drain electrode, the passivation film being in contact with a portion of the semiconductor film between the source electrode and the drain electrode;

an alignment film formed over the passivation film; and a capacitor, the capacitor comprising:
   a capacitor wiring formed over the substrate, wherein the capacitor wiring comprises a same material as the gate electrode;
   the insulating film formed over the capacitor wiring; and
   the pixel electrode formed over the capacitor wiring with the insulating film interposed therebetween, wherein the capacitor wiring extends substantially in parallel with the gate wiring at least in a pixel portion, wherein the capacitor wiring is electrically connected to a terminal portion, and wherein the terminal portion is formed in an edge portion of the substrate.

26. The display device according to claim 25, wherein the pixel electrode is located below the passivation film.

27. The display device according to claim 25, wherein an end surface of the pixel electrode lies substantially in register with and an end surface of the drain electrode.

28. The display device according to claim 25, wherein the pixel electrode is in contact with an end surface of the semiconductor film and an end surface of the drain electrode.

29. The display device according to claim 25, further comprising a transparent conductive film formed over and along with the source wiring, comprising the same material as the pixel electrode.

30. The display device according to claim 29, wherein the transparent conductive film extends beyond both side edges of the source wiring.

31. The display device according to claim 29, wherein the transparent conductive film is electrically separated from the pixel electrode.

32. The display device according to claim 29, wherein an end surface of the transparent conductive film lies substantially in register with an end surface of the source electrode.

33. The display device according to claim 29, wherein the transparent conductive film is in contact with an end surface of the semiconductor film and an end surface of the source electrode.

34. The display device according to claim 25, wherein the terminal portion is electrically connected to a flexible printed circuit.

35. The display device according to claim 25, wherein the gate wiring is electrically connected to the terminal portion.

36. The display device according to claim 25, wherein the passivation film comprises at least one of a silicon oxide film, a silicon nitride film, a silicon oxynitride film, and a tantalum oxide film.

37. A display device comprising:
   a thin film transistor, the thin film transistor comprising:
      a gate electrode formed over a substrate;
      an insulating film formed over the gate electrode;
      a first semiconductor film formed over the insulating film;
      a source electrode formed over the first semiconductor film; and a drain electrode formed over the first semiconductor film;
a pixel electrode comprising a transparent conductive material, formed over the substrate, and connected to the drain electrode;
a source wiring being continuous to the source electrode, formed over the insulating film and a second semiconductor film;
wherein the second semiconductor film is continuous to the first semiconductor film, and comprises the same material as the first semiconductor film,
a gate wiring being continuous to the gate electrode, formed over the substrate;
a passivation film formed over the source electrode and the drain electrode, the passivation film being in contact with a portion of the first semiconductor film between the source electrode and the drain electrode;
an alignment film formed over the passivation film; and
a capacitor, the capacitor comprising;
    a capacitor wiring formed over the substrate, wherein the capacitor wiring comprises a same material as the gate electrode;
    the insulating film formed over the capacitor wiring; and
    the pixel electrode formed over the capacitor wiring with the insulating film interposed therebetween,
wherein the capacitor wiring extends substantially in parallel with the gate wiring at least in a pixel portion,
wherein the capacitor wiring is electrically connected to a terminal portion, and
wherein the terminal portion is formed in an edge portion of the substrate.

38. The display device according to claim 37, wherein the pixel electrode is located below the passivation film.

39. The display device according to claim 37, wherein an end surface of the pixel electrode lies substantially in register with an end surface of the drain electrode.

40. The display device according to claim 37, wherein the pixel electrode is in contact with an end surface of the first semiconductor film and an end surface of the drain electrode.

41. The display device according to claim 37, further comprising a transparent conductive film formed over and along with the source wiring, comprising the same material as the pixel electrode.

42. The display device according to claim 41, wherein the transparent conductive film extends beyond both side edges of the source wiring.

43. The display device according to claim 41, wherein the transparent conductive film is electrically separated from the pixel electrode.

44. The display device according to claim 41, wherein an end surface of the transparent conductive film lies substantially in register with an end surface of the source electrode.

45. The display device according to claim 41, wherein the transparent conductive film is in contact with an end surface of the first semiconductor film and an end surface of the source electrode.

46. The display device according to claim 37, wherein the terminal portion is electrically connected to a flexible printed circuit.

47. The display device according to claim 37, wherein the gate wiring is electrically connected to the terminal portion.

48. The display device according to claim 37, wherein the passivation film comprises at least one of a silicon oxide film, a silicon nitride film, a silicon oxynitride film, and a tantalum oxide film.

\* \* \* \* \*